United States Patent
Nishida et al.

(10) Patent No.: US 6,369,655 B2
(45) Date of Patent: Apr. 9, 2002

(54) FEEDBACK CIRCUIT AND AMPLIFIER AND MIXER COMPRISING THE SAME

(75) Inventors: Masao Nishida, Sakai; Tetsuro Sawai, Oogaki, both of (JP)

(73) Assignee: Sanyo Electric Co., Ltd., Moriguchi (JP)

(*) Notice: Subject to any disclaimer, the term of this patent is extended or adjusted under 35 U.S.C. 154(b) by 0 days.

(21) Appl. No.: 09/760,666

(22) Filed: Jan. 17, 2001

(30) Foreign Application Priority Data

Jan. 18, 2000 (JP) ........................................ 2000-008518

(51) Int. Cl.$^7$ ................................................ H03F 1/34
(52) U.S. Cl. ........................................ 330/294; 330/109
(58) Field of Search ................................. 330/109, 294; 333/175

(56) References Cited

U.S. PATENT DOCUMENTS 3,421,101 A * 1/1969 Drew et al. ................. 330/20
3,717,820 A * 2/1973 Garcia et al. ............... 330/21

FOREIGN PATENT DOCUMENTS

JP        10-290125        10/1998

OTHER PUBLICATIONS

Principles of Electronic circuit (pp. 710–712).*

* cited by examiner

Primary Examiner—Robert Pascal
Assistant Examiner—Henry Choe
(74) Attorney, Agent, or Firm—Armstrong, Westerman & Hattori, LLP

(57) ABSTRACT

A feedback circuit is connected between a drain electrode and a gate electrode of an FET. The feedback circuit is constituted by a series connection of a feedback amount adjusting resistor and an LC series resonance circuit. The LC series resonance circuit is constituted by a series connection of a capacitor and an inductor. The capacitance of the capacitor and the inductance of the inductor are set such that the LC series resonance circuit enters a short-circuited state with respect to an m-th harmonic by resonating at the frequency of the m-th harmonic, and the LC series resonance circuit enters an opened state with respect to a fundamental wave.

12 Claims, 18 Drawing Sheets

FEEDBACK CIRCUIT AND AMPLIFIER AND MIXER COMPRISING THE SAME

BACKGROUND OF THE INVENTION

1. Field of the Invention

The present invention relates to a feedback circuit provided in a transistor and an amplifier and a mixer comprising the same.

2. Description of the Related Art

In recent years, radio waves having a great many frequencies have been required in order to establish communication with the rapid development of mobile communication. The frequencies of the radio waves used in the mobile communication have been shifted to a microwave band. A handy terminal for such mobile communication is provided with an amplifier using a field effect transistor (hereinafter referred to as "FET"). There is a method of providing a feedback circuit in one of the designs of the amplifier.

FIG. 26 is a circuit diagram of an amplifier comprising a conventional feedback circuit.

As shown in FIG. 26, a feedback circuit 200 comprising a resistor 101 and a capacitor 102 is connected between a drain electrode (an output terminal) and a gate electrode (an input terminal) of an FET 100. A signal outputted from the drain electrode of the FET 100 is fed back to the gate electrode in reversed phase by the feedback circuit 200. Consequently, the oscillation of the FET 100 is prevented by a negative feedback effect, and the gain of the FET 100 is adjusted.

On the other hand, in a multi-channel communication system, a wide band amplifier is used to simultaneously amplify a plurality of carrier waves. Generally, when the linearity of the amplifier is degraded, several harmonics such as a second harmonic (second order harmonic) and a third harmonic (third order harmonic) for a fundamental wave are generated. It has been known that the harmonics cause various disturbance waves such as intermodulation distortions.

In the intermodulation distortions, a second order distortion (IM2) is generated mainly as a result of the second harmonic, and third order distortion (IM3) is generated mainly as a result of the third harmonic. Further, in the multi-channel communication system, composite second order distortions (CSO) are generated by the second order distortion on a plurality of channels, and composite triple beat (CTB) and cross modulation (X-MOD) are generated by the third order distortion on the plurality of channels.

When a fundamental wave s1 having a frequency $f_1$ and a fundamental wave s2 having a frequency $f_2$ are inputted to the amplifier, as shown in FIG. 27, for example, disturbance waves im2 respectively having a frequency $(f_1+f_2)$ and a frequency $(f_2-f_1)$ are generated by the composite second order distortions. Further, disturbance waves im3 respectively having a frequency $(2f_2-f_1)$ and a frequency $(2f_1-f_2)$ are generated by the composite third order distortions.

In the case of a cable television system, 100 or more channels exist at spacing of 6 MHz in a band from approximately 100 to 800 MHz. When a fundamental wave having a frequency of 750 MHz ($f_1$) on a certain channel and a fundamental wave having a frequency of 756 MHz ($f_2$) on the other channel, for example, are inputted, disturbance waves are respectively generated at a frequency of 744 MHz ($2f_1-f_2$) and a frequency of 762 MHz ($2f_2-f_1$) in the band due to the composite third order distortions. The respective frequencies of the disturbance waves are the same as the frequency of the adjacent channel. Accordingly, the fundamental wave on the adjacent channel is disturbed by the disturbance waves.

When the fundamental wave having a frequency of 750 MHz ($f_1$) on a certain channel and the fundamental wave having a frequency of 450 MHz ($f_2$) on the other channel are inputted, a disturbance wave is generated at a frequency of 300 MHz ($f_2-f_1$) in the band as a result of the composite second order distortions. The frequency of the disturbance wave is the same as the frequency of the other channel. Accordingly, the fundamental wave of the other channel is disturbed.

Consequently, it is required that a wide band amplifier for simultaneously amplifying a plurality of carrier waves has high linearity in order to prevent multi-channel intermodulation distortions. For example, JP-A-10-290125 discloses a power amplifier having a nonlinear distortion compensating circuit of a feedforward type.

In the power amplifier, in the entire band, an inputted signal is distributed into signals. One of the signals obtained by the distribution is separated into bands requiring nonlinear distortion compensation. A distortion component and the amount of compensation in each of the bands are detected, to synthesize compensating signals. The compensating signal is used, to compensate for the other signal obtained by the distribution.

In the conventional amplifier shown in FIG. 26, the feedback circuit 200 is constituted by the resistor 101 and the capacitor 102. Even when the resistance value of the resistor 101 and the capacitance value of the capacitor 102 are set such that a desired frequency is negatively fed back, therefore, not only the desired frequency but also all frequencies are negatively fed back. Particularly, the feedback circuit 200 has the capacitor 102. When the frequency is increased, therefore, the impedance is decreased. Accordingly, the higher the order of a harmonic is than that of the second harmonic, the larger the amount of feedback thereof is. That is, it is impossible to perform setting such that a particular frequency is not fed back.

If the setting is performed such that a second harmonic having a frequency which is two times the frequency of the fundamental wave or a harmonic of a higher order than the second harmonic is fed back, the fundamental wave is fed back to some extent. As a result, the characteristics of the amplifier and particularly, the gain thereof is degraded. A matching circuit for impedance matching with a load circuit connected to the amplifier is difficult to design.

On the other hand, in the power amplifier disclosed in JP-A-10-290125, several circuits such as a circuit for distributing a signal in an input portion, a circuit for separating each of signals obtained by the distribution into bands, a circuit for detecting a distortion component and the amount of compensation in each of the bands, and a circuit for synthesizing compensating signals must be provided. Accordingly, the circuit scale is significantly increased, and the power consumption in the circuits is also increased.

It is necessary to determine a pass-band of a band-pass filter in conformity with the bandwidth of a channel in a communication system using the power amplifier. Consequently, the power amplifier designed for a certain communication system cannot be applied to another communication system which differs in the channel bandwidth.

SUMMARY OF THE INVENTION

An object of the present invention is to provide a feedback circuit capable of reducing nonlinear distortion generated in a transistor on a small circuit scale.

Another object of the present invention is to provide an amplifier comprising a feedback circuit capable of reducing nonlinear distortion generated in a transistor on a small circuit scale.

Still another object of the present invention is to provide a mixer comprising a feedback circuit capable of reducing nonlinear distortion generated in a transistor on a small circuit scale.

A feedback circuit connected between an output terminal and an input terminal of a transistor according to one aspect of the present invention comprises at least one series connection circuit comprising a series connection of a capacitance and an inductance, the value of the capacitance and the value of the inductance of the at least one series connection circuit being set such that the at least one series connection circuit enters a substantially opened state with respect to a first frequency, and the at least one series connection circuit enters a substantially short-circuited state with respect to a second frequency.

In the feedback circuit, the series connection circuit including the series connection of the capacitance and the inductance enters the substantially opened state with respect to the first frequency and enters the substantially short-circuited state with respect to the second frequency. Consequently, a component having the second frequency of a signal outputted from the output terminal of the transistor is negatively fed back to the input terminal, and the component having the second frequency inputted to the input terminal is canceled by a component having the second frequency negatively fed back.

As a result, it is possible to reduce nonlinear distortion generated by the component having the second frequency without decreasing the gain for the component having the first frequency. Further, the feedback circuit is constituted by the series connection circuit including the capacitance and the inductance, so that the circuit scale is small.

The fact that the series connection circuit enters the substantially opened state with respect to the first frequency and enters the substantially short-circuited state with respect to the second frequency means that the impedance of the series connection circuit increases to infinity or a sufficiently high value with respect to the first frequency, and reduces to zero or a sufficiently low value with respect to the second frequency.

The at least one series connection circuit may include a plurality of series connection circuits, the plurality of series connection circuits may be connected in parallel between the output terminal and the input terminal of the transistor, the values of the capacitances and the values of the inductances of the plurality of series connection circuits being set such that each of the series connection circuits enters a substantially opened state with respect to the first frequency, and the series connection circuits enter a substantially short-circuited state, respectively, with respect to different second frequencies.

In the feedback circuit, the plurality of series connection circuits each comprising the series connection of the capacitance and the inductance enters the substantially opened state with respect to the first frequency, and the series connection circuits enter the substantially short-circuited state, respectively, with respect to the different second frequencies. Consequently, components having the plurality of different second frequencies of a signal outputted from the output terminal of the transistor are negatively fed back to the input terminal, and components having the plurality second frequencies inputted to the input terminal are respectively canceled by the components having the second frequencies negatively fed back.

As a result, it is possible to reduce nonlinear distortion generated by the components having the plurality of different second frequencies without decreasing the gain for the component having the first frequency. Further, the feedback circuit is constituted by the plurality of series connection circuits each comprising the series connection of the capacitance and the inductance, so that the circuit scale is small.

The first frequency may be the frequency of a fundamental wave, and the second frequency may be the frequency of a harmonic corresponding to the fundamental wave. The second frequency may be the frequency of a third harmonic or a fifth harmonic corresponding to the fundamental wave.

In this case, the harmonic outputted from the output terminal of the transistor is negatively fed back to the input terminal, and the harmonic inputted to the input terminal is canceled by the harmonic negatively fed back. Consequently, the harmonic is prevented without decreasing the gain for the fundamental wave. As a result, it is possible to reduce nonlinear distortion generated by the harmonic.

The first frequency may include parts or all of frequencies in a band corresponding to a communication system, or may include a frequency most adjacent to the band corresponding to the communication system. Further, the second frequency is a harmonic having the first frequency, and may include a frequency which is an integral multiple of the frequency in the band including the first frequency.

The second frequency may be the frequency of a fundamental wave, and the first frequency may be the frequency of a harmonic corresponding to the fundamental wave. The first frequency may be the frequency of a third harmonic or a fifth harmonic corresponding to the fundamental wave.

In this case, the fundamental wave of the signal outputted from the output terminal of the transistor is negatively fed back to the input terminal. Consequently, the oscillation of the transistor at the frequency of the fundamental wave is prevented. As a result, the transistor is stabilized.

The feedback circuit may further comprise a feedback amount adjusting resistor connected in series with the at least one series connection circuit.

In this case, the amount of feedback power of the component having the second frequency from the output terminal to the input terminal of the transistor can be adjusted by adjusting the value of the feedback amount adjusting resistor.

A feedback circuit connected between an output terminal and an input terminal of a transistor according to another aspect of the present invention further comprises a high pass filter having the property of preventing a component having a first frequency and passing a component having a second frequency higher than the first frequency.

In the feedback circuit, the high pass filter prevents the component having the first frequency and passes the component having the second frequency higher than the first frequency. Consequently, the component having the second frequency of the signal outputted from the output terminal of the transistor is negatively fed back to the input terminal, and the component having the second frequency inputted to the input terminal is canceled by the component having the second frequency negatively fed back.

As a result, it is possible to reduce nonlinear distortion generated by the component having the second frequency without decreasing the gain for the component having the first frequency. Further, the feedback circuit is constituted by the high pass filter, so that the circuit scale is small.

It is preferable that the first frequency is included in a band including a channel to be used, and the cut-off frequency of the high pass filter is higher than the highest frequency in the band including the channel.

In this case, the component having the first frequency included in the band including the channel of the signal outputted from the output terminal of the transistor is not negatively fed back to the input terminal, and the component having the frequency higher than the highest frequency in the band including the channel is negatively fed back to the input terminal. Consequently, at least one harmonic corresponding to at least one fundamental wave included in the band including the channel is negatively fed back, and the harmonic inputted to the input terminal is canceled by the harmonic negatively fed back. As a result, it is possible to reduce nonlinear distortion generated by the harmonic without decreasing the gain for the fundamental wave included in the band including the channel.

It is preferable that the cut-off frequency of the high pass filter is not more than three times the highest frequency in the band including the channel.

In this case, at least the component having the frequency which is higher than the highest frequency in the band including the channel and is not more than three times the highest frequency of the signal outputted from the output terminal of the transistor is negatively fed back to the input terminal. Consequently, the hither harmonic on the third or more order with respect to at least one fundamental wave in the band including the channel is negatively fed back, and the harmonic on the third or more order which is inputted to the input terminal is canceled by the harmonic on the third or more order negatively fed back. As a result, it is possible to reduce nonlinear distortion generated by the harmonic on the third or more order.

The feedback circuit may further comprise a feedback amount adjusting resistor connected in series with the high pass filter.

In this case, the value of the feedback amount adjusting resistor is adjusted, thereby making it possible to adjust the amount of feedback power of the component having the second frequency from the output terminal to the input terminal of the transistor.

An amplifier according to still another aspect of the present invention comprises a transistor; and a feedback circuit connected between an output terminal and an input terminal of the transistor, the feedback circuit comprising at least one series connection circuit comprising a series connection of a capacitance and an inductance, the value of the capacitance and the value of the inductance of the at least one series connection circuit being set such that the at least one series connection circuit enters a substantially opened state with respect to a first frequency, and the at least one series connection circuit enters a substantially short-circuited state with respect to a second frequency.

In the amplifier, the feedback circuit is connected between the output terminal and the input terminal of the transistor. Accordingly, it is possible to reduce nonlinear distortion generated by a component having the second frequency without decreasing the gain for a component having the first frequency. Further, the circuit scale of the feedback circuit is small, thereby making it possible to miniaturize the amplifier.

The at least one series connection circuit may include a plurality of series connection circuits, the values of the capacitances and the values of the inductances of the plurality of series connection circuits being set such that each of the series connection circuits enters a substantially opened state with respect to the first frequency, and the series connection circuits enter a substantially short-circuited state, respectively, with respect to different second frequencies.

In this case, it is possible to reduce the nonlinear distortion generated by components having the plurality of different second frequencies without decreasing the gain for a component having the first frequency. Further, the feedback circuit is constituted by the plurality of series connection circuits each comprising the series connection of the capacitance and the inductance, so that the circuit scale is small.

An amplifier according to still another aspect of the present invention comprises a transistor; and a feedback circuit connected between an output terminal and an input terminal of the transistor, the feedback circuit comprising a high pass filter having the property of preventing a component having a first frequency and passing a component having a second frequency higher than the first frequency.

In the amplifier, the feedback circuit is connected between the output terminal and the input terminal of the transistor. Accordingly, it is possible to reduce nonlinear distortion generated by the component having the second frequency without decreasing the gain for the component having the first frequency. Further, the feedback circuit is constituted by the high pass filter, so that the circuit scale is small.

It is preferable that the first frequency is included in a band including a channel to be used, and the cut-off frequency of the high pass filter is higher than the highest frequency in the band including the channel.

In this case, the component having the first frequency included in the band including the channel of a signal outputted from the output terminal of the transistor is not negatively fed back to the input terminal, and the component having the frequency higher than the highest frequency in the band including the channel is negatively fed back. Consequently, at least one harmonic with respect to at least one fundamental wave included in the band including the channel is negatively fed back, and the harmonic inputted to the input terminal is canceled by the harmonic negatively fed back. As a result, it is possible to reduce nonlinear distortion generated by the harmonic without decreasing the gain for the fundamental wave included in the band including the channel.

A mixer according to still another aspect of the present invention comprises a transistor; and a feedback circuit connected between an output terminal and an input terminal of the transistor, the feedback circuit comprising at least one series connection circuit comprising a series connection of a capacitance and an inductance, the at least one series connection circuit being connected between the output terminal and the input terminal of the transistor, the value of the capacitance and the value of the inductance of the at least one series connection circuit being set such that the at least one series connection circuit enters a substantially opened state with respect to a first frequency, and the at least one series connection circuit enters a substantially short-circuited state with respect to a second frequency.

In the mixer, the feedback circuit is connected between the output terminal and the input terminal of the transistor. Accordingly, it is possible to reduce nonlinear distortion generated by a component having the second frequency without decreasing the gain for a component having the first frequency. Further, it is possible to reduce the nonlinear distortion generated by the component having the second frequency. Further, the circuit scale of the feedback circuit is small, thereby making it possible to miniaturize the mixer.

The first frequency may include parts or all of frequencies in a band corresponding to a communication system. When the second frequency is the harmonic having the first frequency, the second frequency may include a frequency which is an integral multiple of the frequency in the band including the first frequency.

The transistor may be a field effect transistor having first and second gate electrodes respectively receiving first and second high-frequency signals.

In this case, the first high-frequency signal fed to the first gate electrode and the second high-frequency signal fed to the second gate electrode are mixed with each other.

A mixer according to still another aspect of the present invention comprises a transistor; and a feedback circuit connected between an output terminal and an input terminal of the transistor, the feedback circuit comprising a high pass filter having the property of preventing a component having a first frequency and passing a component having a second frequency higher than the first frequency.

In the mixer, the feedback circuit is connected between the output terminal and the input terminal of the transistor. Accordingly, it is possible to reduce nonlinear distortion generated by the component having the second frequency without decreasing the gain for the component having the first frequency. Further, the feedback circuit is constituted by the high pass filter, so that the circuit scale is small.

The transistor is a field effect transistor having first and second gate electrodes respectively receiving first and second high-frequency signals.

In this case, the first high frequency signal fed to the first gate electrode and the second high frequency signal fed to the second gate electrode are mixed with each other.

It is preferable that the first frequency is included in a band including a channel to be used, and the cut-off frequency of the high pass filter is higher than the highest frequency in the band including the channel.

In this case, the component having the first frequency included in the band including the channel of a signal outputted from the output terminal of the transistor is not negatively fed back to the input terminal, and the component having the frequency higher than the highest frequency in the band including the channel is negatively fed back. Consequently, at least one harmonic corresponding to at least one fundamental wave included in the band including the channel is negatively fed back, and the harmonic inputted to the input terminal is canceled by the harmonic negatively fed back. As a result, it is possible to reduce nonlinear distortion generated by the harmonic without decreasing the gain for the fundamental wave included in the band including the channel.

The foregoing and other objects, features, aspects and advantages of the present invention will become more apparent from the following detailed description of the present invention when taken in conjunction with the accompanying drawings.

DESCRIPTION OF PREFERRED EMBODIMENTS

Figure 1:
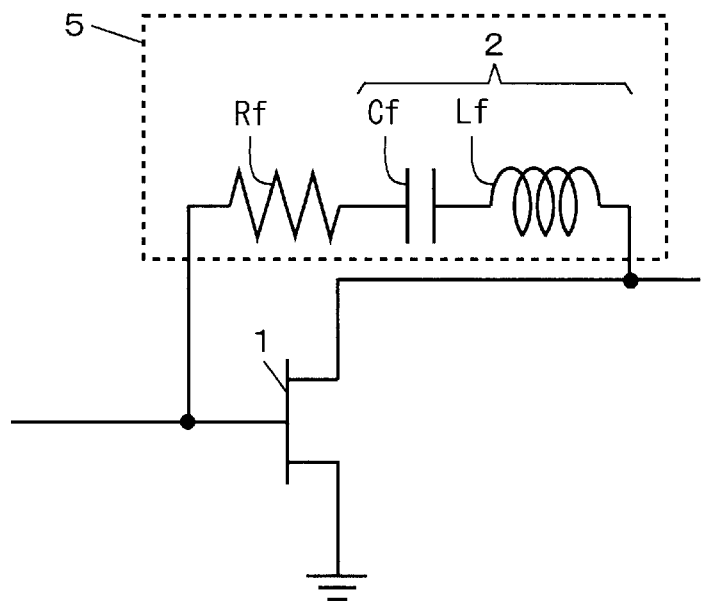
FIG. 1 is a circuit diagram of an amplifier comprising a feedback circuit in a first embodiment of the present invention.

FIG. 1 is a circuit diagram of an amplifier comprising a feedback circuit in a first embodiment of the present invention.

In FIG. 1, a feedback circuit 5 is connected between a drain electrode (an output terminal) and a gate electrode (an input terminal) of an FET 1. The feedback circuit 5 is constituted by a series connection of a feedback amount adjusting resistor Rf and an LC series resonance circuit 2. The LC series resonance circuit 2 is constituted by a series connection of a capacitor Cf and an inductor Lf.

As a first example, the capacitance value of the capacitor Cf and the inductance of the inductor Lf are set such that the LC series resonance circuit 2 enters a short-circuited state, that is, the impedance of the LC series resonance circuit 2 becomes zero with respect to an m-th harmonic by resonating at the frequency of the m-th harmonic, and the LC series resonance circuit 2 enters an opened state, that is, the impedance of the LC series resonance circuit 2 increases to infinity with respect to a fundamental wave, where m is an integer of not less than two. Consequently, only the m-th harmonic in the signal outputted from the drain electrode of the FET 1 is fed back to a gate electrode.

In this case, a signal outputted from the drain electrode of the FET 1 differs in phase from the signal inputted to the gate electrode by 180 degrees. Therefore, the m-th harmonic is negatively fed back. As a result, the m-th harmonic inputted to the gate electrode of the FET 1 is canceled by the m-th harmonic negatively fed back. The m-th harmonic is thus restrained, so that m-th order distortion is reduced. In this case, the resistance value of the feedback amount adjusting resistor Rf is adjusted, thereby making it possible to adjust the amount of feedback power of the m-th harmonic.

As a second example, the capacitance value of the capacitor Cf and the inductance of the inductor Lf are set such that the LC series resonance circuit 2 enters a short-circuited state by resonating at the frequency of a fundamental wave, and the LC series resonance circuit 2 enters an opened state with respect to the m-th harmonic. Consequently, only the fundamental wave of the signal outputted from the drain electrode of the FET 1 is negatively fed back to the gate electrode. As a result, the oscillation of the FET 1 at the frequency of the fundamental wave is prevented.

Figure 2:
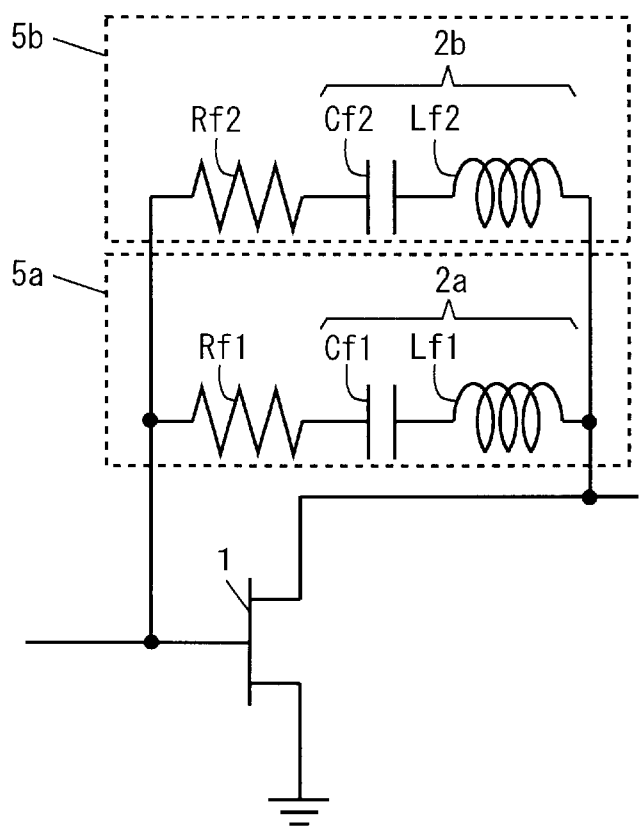
FIG. 2 is a circuit diagram of an amplifier comprising feedback circuits in a second embodiment of the present invention.

FIG. 2 is a circuit diagram of an amplifier comprising a feedback circuit in a second embodiment of the present invention.

In FIG. 2, two feedback circuits 5a and 5b are connected in parallel between a drain electrode and a gate electrode of an FET 1. The feedback circuit 5a is constituted by a series connection of an LC series resonance circuit 2a and a feedback amount adjusting resistor Rf1. The LC series resonance circuit 2a is constituted by a series connection of a capacitor Cf1 and an inductor Lf1. Similarly, the feedback circuit 5b is constituted by a series connection of an LC series resonance circuit 2b and a feedback amount adjusting resistor Rf2. The LC series resonance circuit 2b is constituted by a series connection of a capacitor Cf2 and an inductor Lf2.

For example, the capacitance value of the capacitor Cf1 and the inductance of the inductor Lf1 are set such that the LC series resonance circuit 2a enters a short-circuited state with respect to an m-th harmonic by resonating at the frequency of the m-th harmonic, and the LC series resonance circuit 2a enters an opened state with respect to the fundamental wave, and the capacitance value of the capacitor Cf2 and the inductance of the inductor Lf2 are set such that the LC series resonance circuit 2b enters a short-circuited state with respect to an n-th harmonic by resonating at the frequency of the n-th harmonic, and the LC series resonance circuit 2b enters an opened state with respect to the fundamental wave, where m and n are integers of not less than two. Consequently, only the m-th harmonic and the n-th harmonic of a signal outputted from the drain electrode of the FET 1 are negatively fed back to the gate electrode. As a result, the m-th harmonic and the n-th harmonic are restrained, so that m-th order distortion and n-th order distortion are reduced. In this case, the resistance values of the feedback amount adjusting resistors Rf1 and Rf2 are adjusted, thereby making it possible to adjust the amounts of feedback power of the m-th harmonic and the n-th harmonic.

A negative feedback effect in the amplifiers shown in FIGS. 1 and 2 is examined by circuit simulation. In the feedback circuit 5 shown in FIG. 1 and the feedback circuits 5a and 5b shown in FIG. 2, the inductances of the capacitors Cf, Cf1, and Cf2 are set such that the impedance is approximately zero with respect to odd order harmonics, and the feedback circuit 5 enters an opened state with respect to the frequency of the fundamental wave in order to prevent the gain for the fundamental wave from being decreased. The drain bias of the FET 1 is set to 10 V, and the gate bias is set to −4 V, an input matching circuit is connected to the gate electrode of the FET 1, and an output matching circuit is connected to the drain electrode thereof. The frequency of the fundamental wave is 1 GHz.

In the amplifier shown in FIG. 1, the capacitance value of the capacitor Cf and the inductance of the inductor Lf in the feedback circuit 5 are selected such that a third harmonic is negatively fed back. In this case, the capacitance value of the capacitor Cf is set to a small value, and the inductance of the inductor Lf is set to a large value such that the fundamental wave is not affected. Specifically, the resistance value of the feedback amount adjusting resistor Rf is set to 30 Ω, the capacitance value of the capacitor Cf is set to 1.0 pF, and the inductance of the inductor Lf is set to 20.26 nH. The input/output power characteristics of the amplifier are found.

In the amplifier shown in FIG. 1, the capacitance value of the capacitor Cf and the inductance of the inductor Lf in the feedback circuit 5 are selected such that a fifth harmonic is negatively fed back. Specifically, the resistance value of the feedback amount adjusting resistor Rf is set to 30 Ω, and the capacitance value of the capacitor Cf is set to 0.05 pF, and the inductance of the inductor Lf is set to 20.26 nH. The input/output power characteristics of the amplifier are found.

Furthermore, in the amplifier shown in FIG. 2, the capacitance values of the capacitors Cf1 and Cf2 and the inductances of the inductors Lf1 and Lf2 in the feedback circuits 5a and 5b are set such that a third harmonic and a fifth harmonic are negatively fed back. The input/output power characteristics of the amplifier are found.

Figure 3:
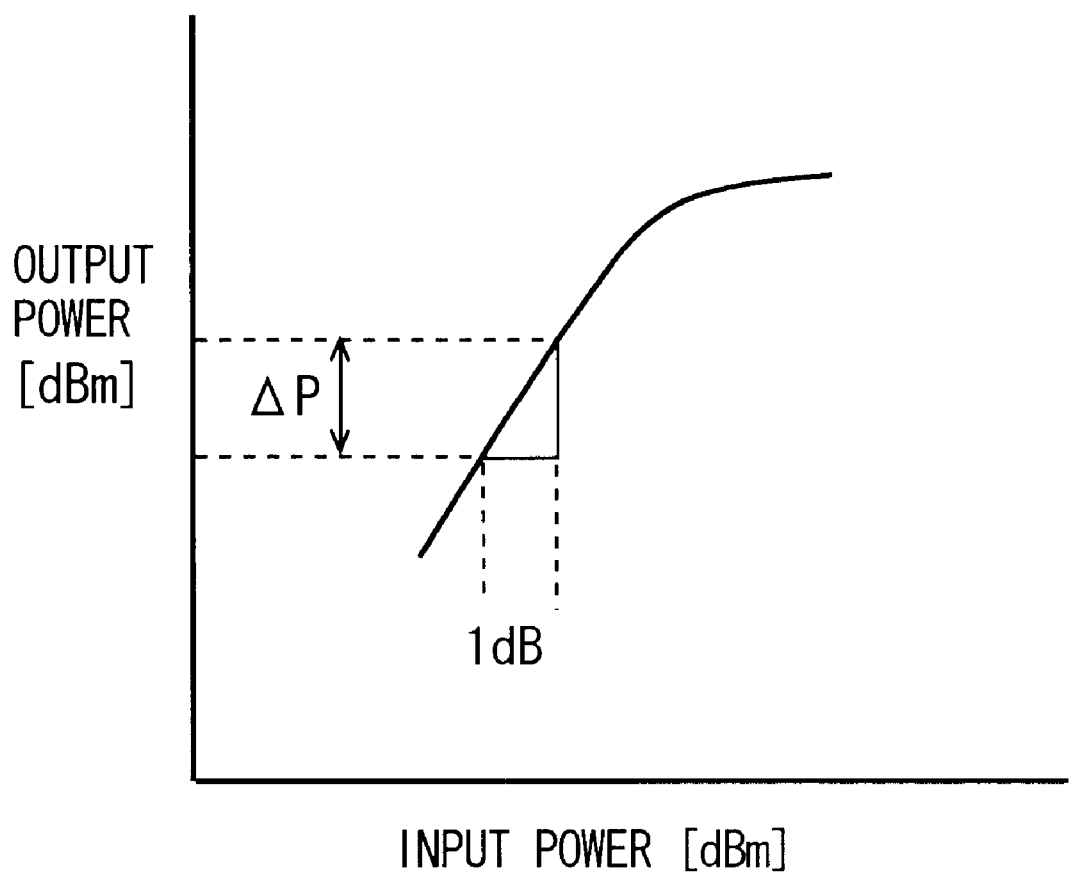
FIG. 3 is a diagram showing an example of input/output power characteristics.

In the input/output power characteristics shown in FIG. 3, when input power changes by 1 dB in a linear region, the amount of change in output power is 1 dB. The shift of the amount of change ΔP from 1 dB represents distortion.

Figure 4:
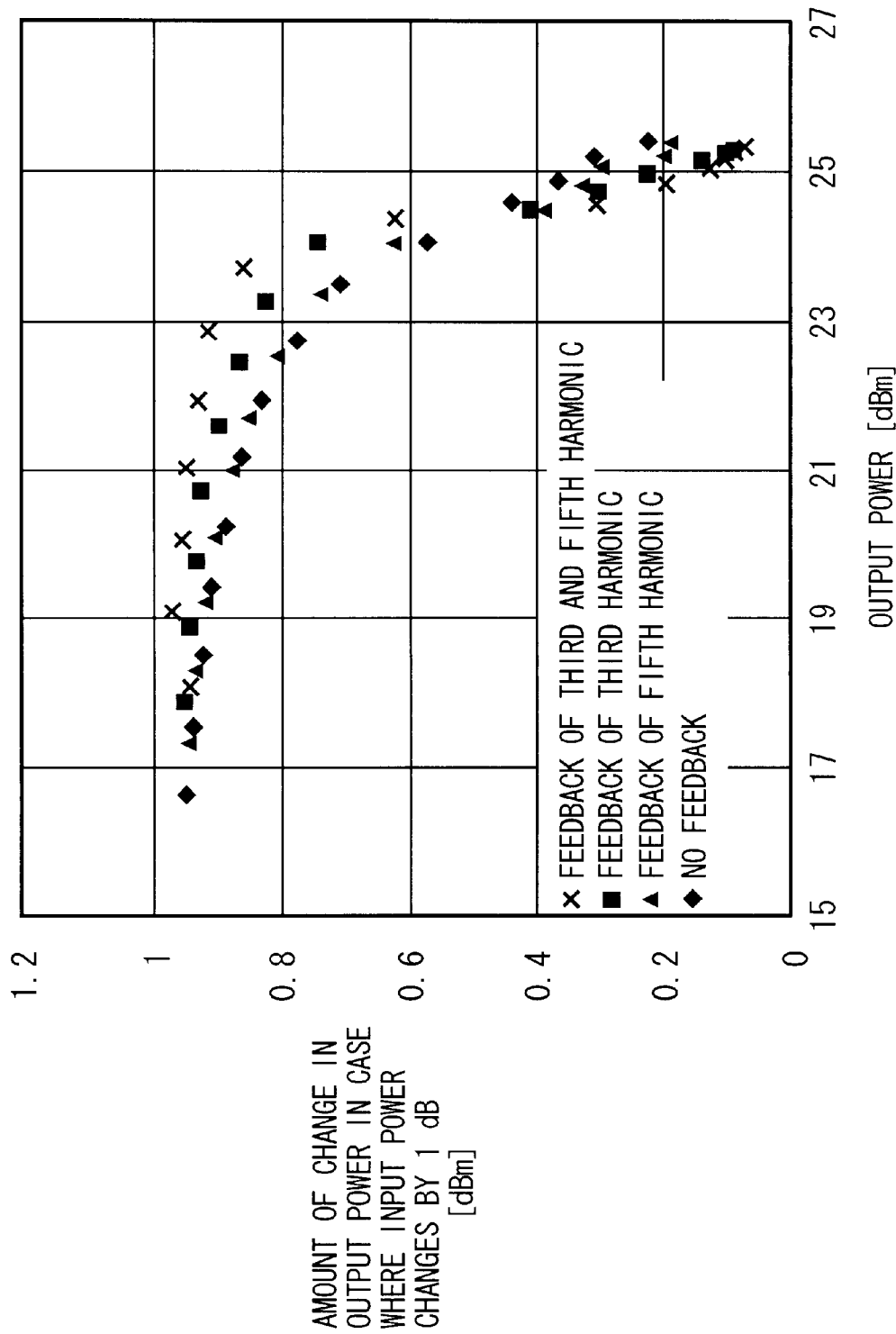
FIG. 4 is a diagram showing the results of simulation of the amount of change in output power in a case where input power changes by 1 dB in the amplifiers shown in FIGS. 1 and 2.

FIG. 4 is a diagram showing the results of simulation of the amount of change in output power in a case where input power changes by 1 dB in the amplifiers shown in FIGS. 1 and 2. In FIG. 4, output power is used to enter the horizontal axis, and output power in a case where input power changes by 1 dB is used to enter the vertical axis.

As shown in FIG. 4, when the third harmonic is fed back, the amount of change in output power is close to 1 dB in the vicinity of output power of 23 dBm, as compared with that in a case where it is not fed back, so that the effect of improving distortion by negative feedback is produced. When both the third harmonic and the fifth harmonic are fed back, the amount of change in output power is closer to 1 dB in the vicinity of output power of 23 dBm, as compared with that in a case where it is not fed back, so that the effect of improving distortion by negative feedback is more significantly produced. When the fifth harmonic is fed back, the effect of improving distortion is slightly produced. Consequently, in the vicinity of output power of 23 dBm, the distortion can be reduced by negatively feeding back odd order harmonics.

Figure 5:
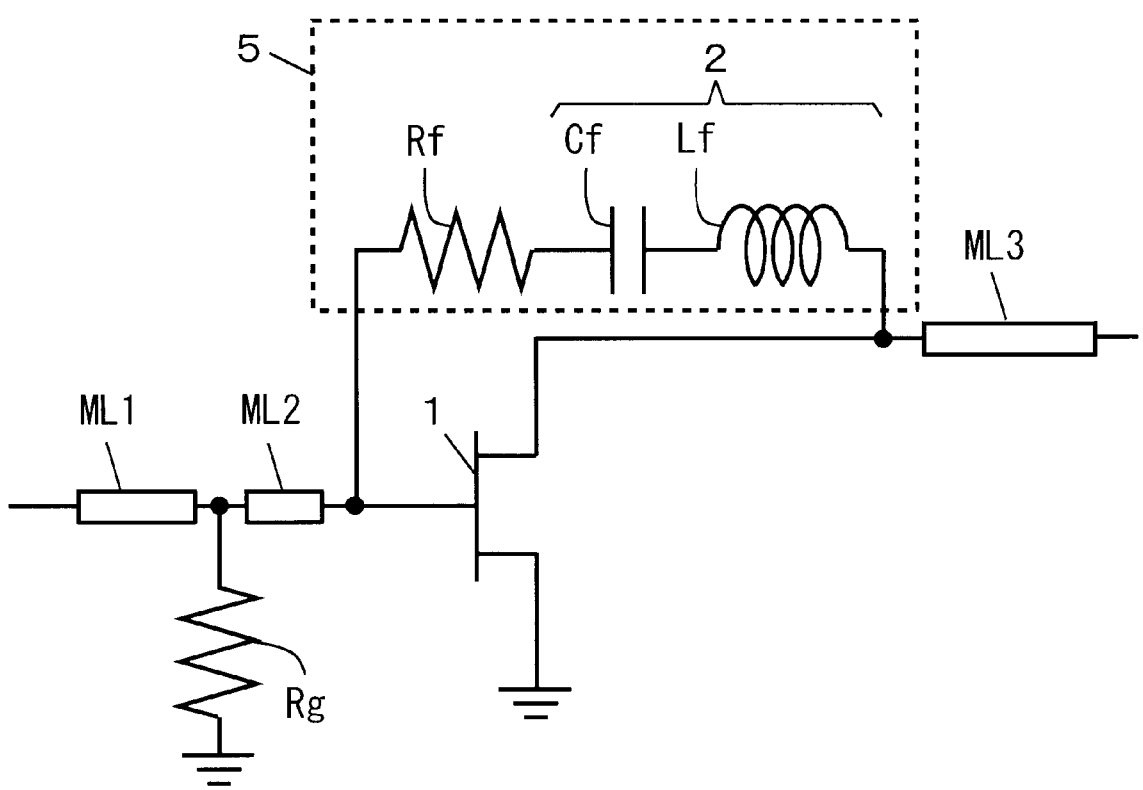
FIG. 5 is a diagram showing a circuit used for measuring the relationship among output power, power load efficiency and adjacent channel leakage power.

The relationship among output power, power addition efficiency and adjacent channel leakage power is then actually measured using a circuit shown in FIG. 5.

In FIG. 5, a feedback circuit 5 is connected between a drain electrode and a gate electrode of an FET 1, microstrip lines ML1 and ML2 are connected to the gate electrode, and a node between the microstrip lines ML1 and ML2 is grounded through a gate resistor Rg. A microstrip line ML3 is connected to a drain electrode of the FET 1.

The gate width of the FET 1 is 16 mm. In the measurement, a signal obtained by offset π/4QPSK (Quadriphase Phase Shift Keying) modulation is inputted to the gate electrode of the FET 1. The frequency of the fundamental wave is 900 MHz. When as bias conditions, the drain bias is set to 3.5 V, and the gate bias is set to −0.3 V, the drain current is 420 mA.

Figure 6:
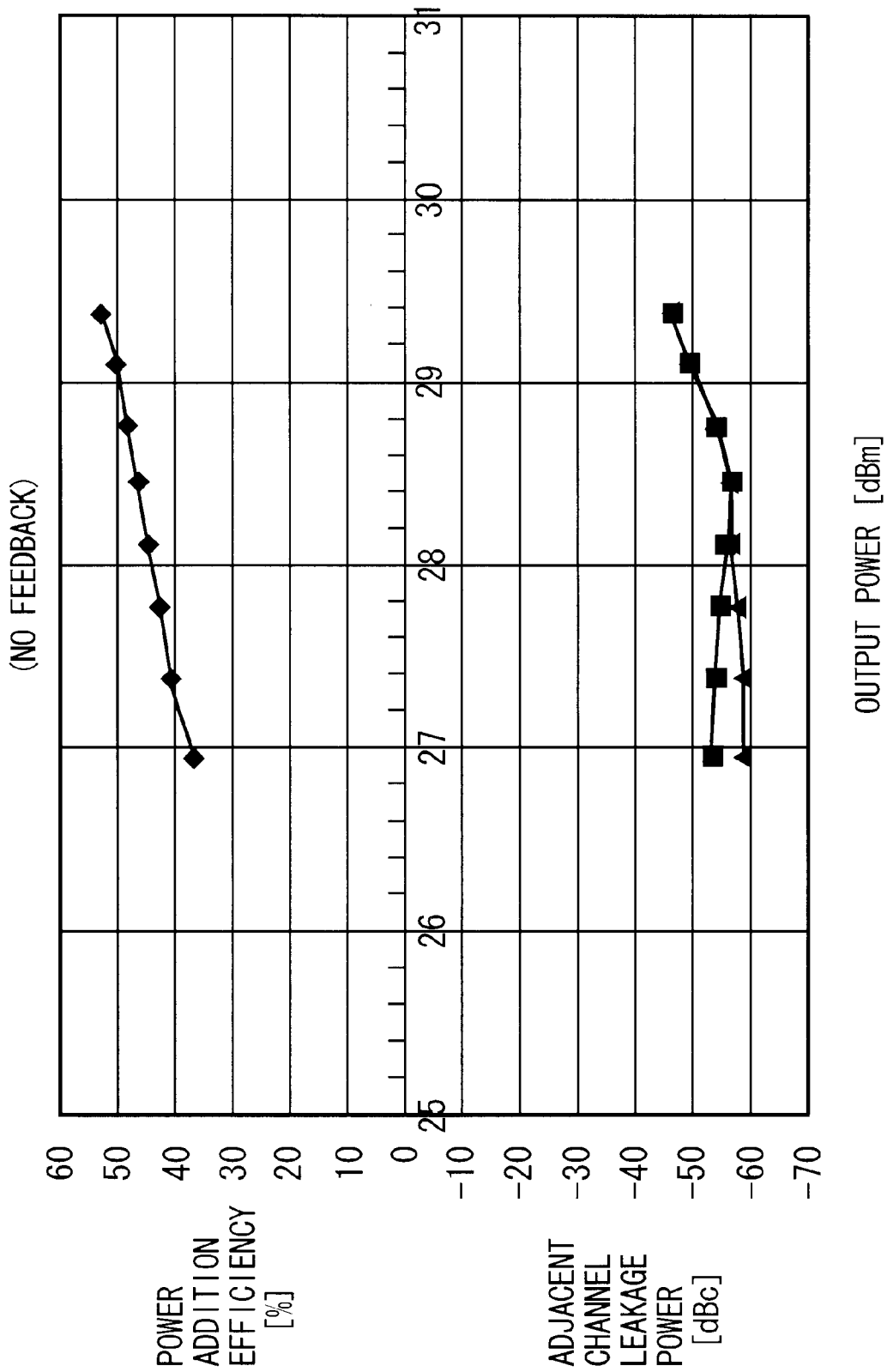
FIG. 6 is a diagram showing the results of measurement of the relationship among output power, power load efficiency, and adjacent channel leakage power in a case where no feedback circuit is provided.

FIG. 6 is a diagram showing the results of measurement of the relationship among output power, power addition efficiency, and adjacent channel leakage power in a case where no feedback circuit 5 is provided. The drain bias is 3.5 V, and the gate bias is −0.3.

Figure 7:
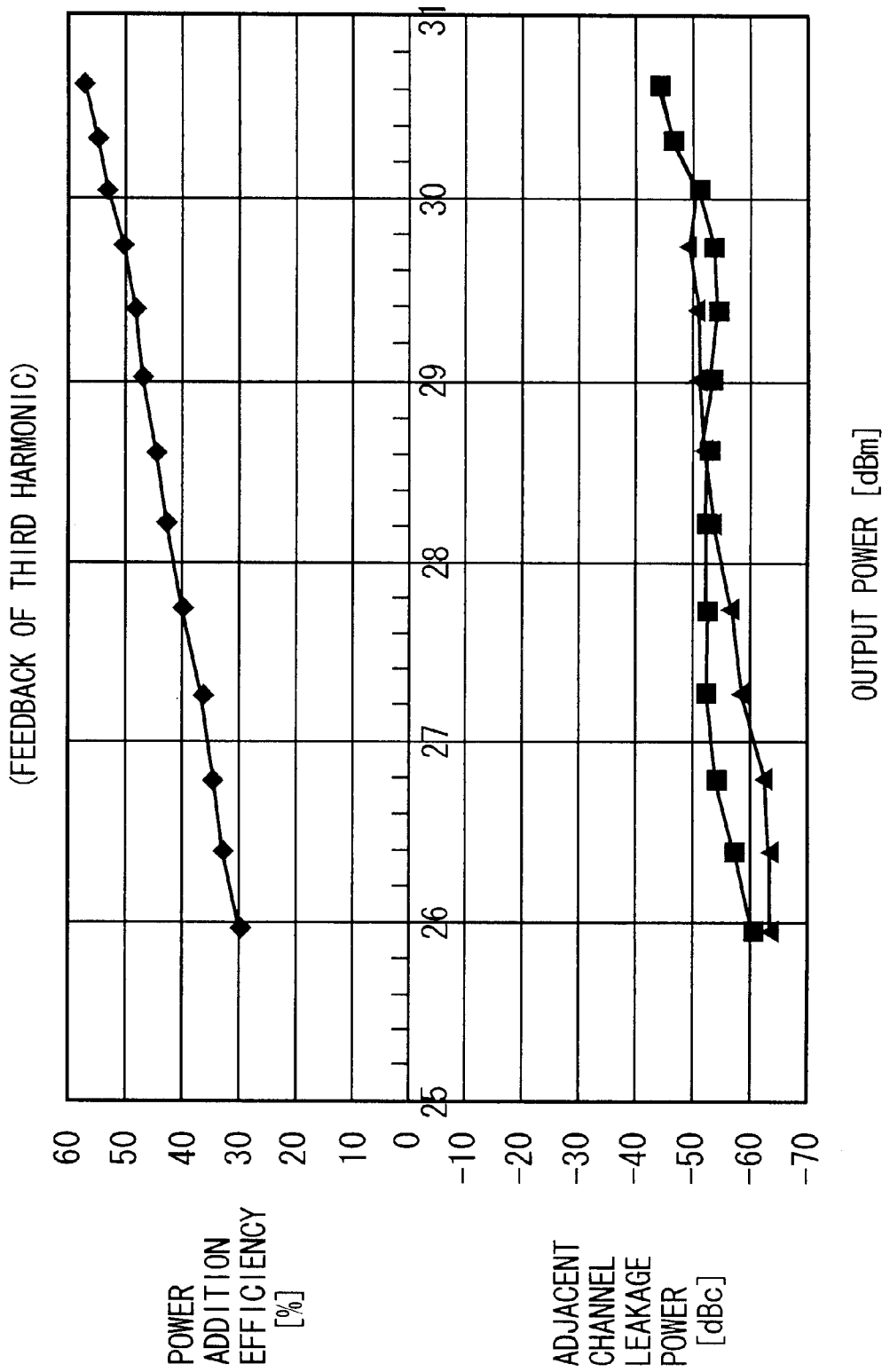
FIG. 7 is a diagram showing the results of measurement of output power, power load efficiency and adjacent channel leakage power in a case where a third harmonic is fed back by a feedback circuit.

FIG. 7 is a diagram showing the results of measurement of output power, power addition efficiency and adjacent channel leakage power in a case where a third harmonic is fed back by the feedback circuit 5. The bias conditions are the same as those in the case shown in FIG. 6.

In the measurement, 1608 type (0.8 mm×1.6 mm) chip components are used as the capacitor Cf, the inductor Lf, the feedback amount adjusting resistor Rf, and the gate resistor Rg. The chip capacitance has an inductance component of approximately 0.7 nH. The capacitance value of the capacitor Cf is set to 1.0 pF, the inductance of the inductor Lf is set to 2.7 nH, and the resistance value of the feedback amount adjusting resistor Rf is set to 39 Ω. The resistance value of the gate resistor Rg is set to 270 Ω. The resonance frequency of the LC series resonance circuit 2 at the time of the measurement is 2.745 GHz.

Figure 8:
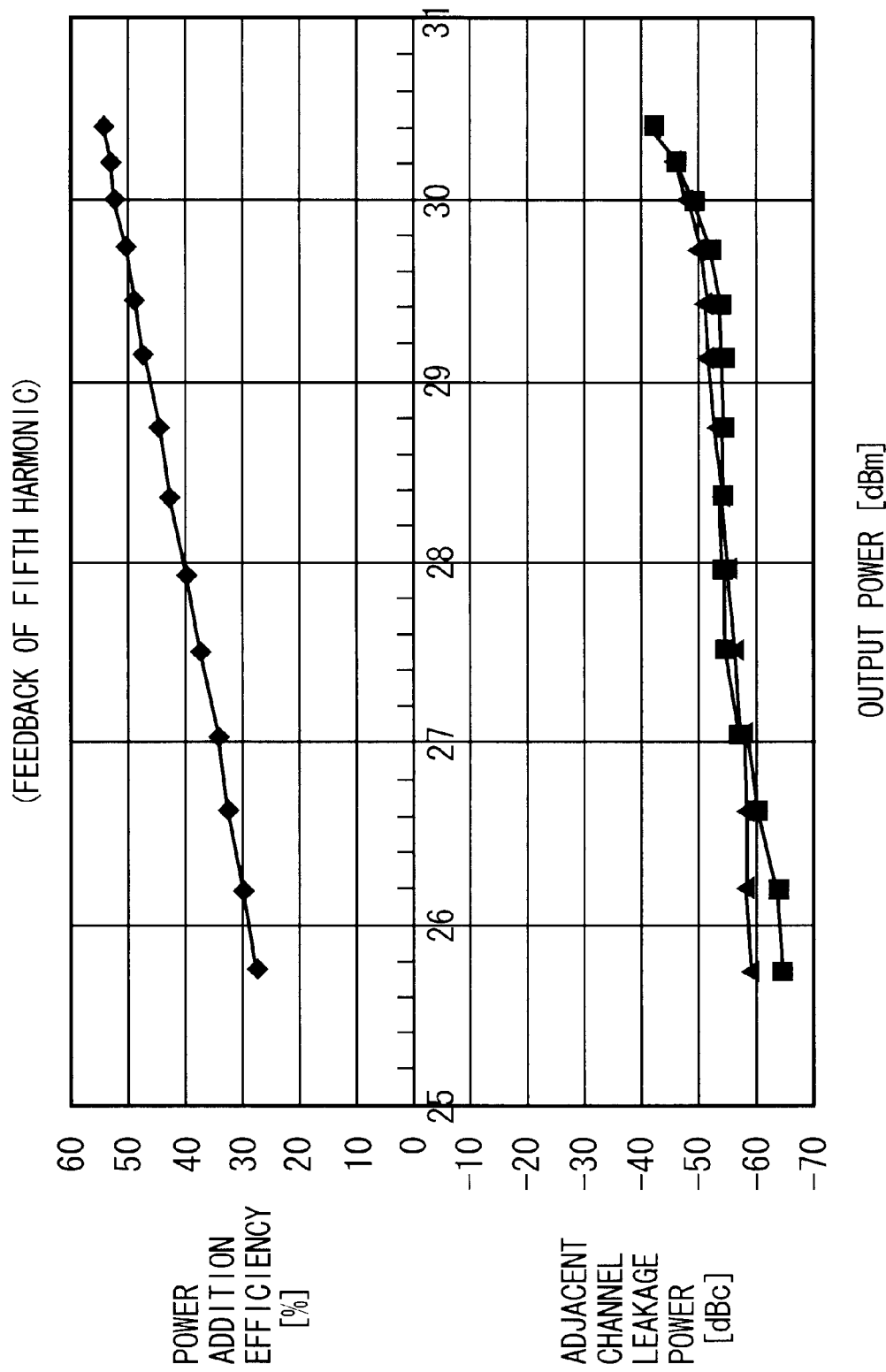
FIG. 8 is a diagram showing the results of measurement of output power, power load efficiency and adjacent channel leakage power in a case where a fifth harmonic is fed back by a feedback circuit.

FIG. 8 is a diagram showing the results of measurement of output power, power addition efficiency and adjacent channel leakage power in a case where a fifth harmonic is fed back by the feedback circuit 5. The drain bias is 3.5 V, and the gate bias is −0.25 V.

In the measurement, 1005 type (0.5 mm×1.0 mm) chip components are used as the capacitor Cf, the inductor Lf, the feedback amount adjusting resistor Rf, and the gate resistor Rg. The chip capacitance has an inductance component of approximately 0.9 nH. The capacitance value of the capacitor Cf is set to 0.5 pF, the inductance of the inductor Lf is set to 1.5 nH, the resistance value of the feedback amount adjusting resistor Rf is set to 39 Ω. the resistance value of the gate resistor Rg is set to 270 Ω. The resonance frequency of the LC series resonance circuit 2 at the time of the measurement is approximately 4.5 GHz.

The adjacent channel leakage power appears on both sides of one fundamental wave. Consequently, two characteristics of the adjacent channel leakage power are illustrated in each of FIGS. 6, 7, and 8.

The power addition efficiency $A_{dd}$ is expressed by the following equation:

$$A_{dd}=(P_{out}-P_{in})/P_{dc} \tag{1}$$

$P_{out}$ denotes the output power of the fundamental wave, $P_{in}$ denotes the input power of the fundamental wave, and $P_{dc}$ denotes supplied DC power.

The power addition efficiency and the adjacent channel leakage power have a trade-off relationship, so that if one of them is increased, the other is decreased. It is desired that both the power addition efficiency and the adjacent channel leakage power are good in output power of 30 dBm (=1 W). In the PDC (Personal Digital Cellular) standard, the adjacent channel leakage power is defined as not more than −45 dBc, and a margin of 5 dBc is generally allowed. Consequently, it is preferable that the power addition efficiency is not less than 50% in output power of 30 dBm (=1 W), and the adjacent channel leakage power is lower than −50 dBc, for example.

As shown in FIG. 6, when there is no feedback circuit 5, the adjacent channel leakage power exceeds −50 dBc in output power of 29 dBm. Consequently, the output power is limited to not more than 29 dBm by the adjacent leakage power characteristics.

On the other hand, as shown in FIG. 7, when the third harmonic is fed back by the feedback circuit 5, the adjacent channel leakage power exceeds −50 dBc in output power of not less than 30 dBm. That is, the output characteristics are improved by reducing distortion. The power addition efficiency is 53% in output power of 30 dBm. The third harmonic is thus fed back by the feedback circuit 5, thereby reducing distortion and increasing output power.

As shown in FIG. 8, when the fifth harmonic is fed back by the feedback circuit 5, the adjacent channel leakage power is approximately −50 dBc in output power of approximately 30 dBm. Further, the power addition efficiency is 52% in output power of 30 dBm. Even when the fifth harmonic is fed back by the feedback circuit 5, therefore, lower distortion and higher output power are realized, as compared with those in a case where the feedback circuit 5 is not provided.

Figure 9:
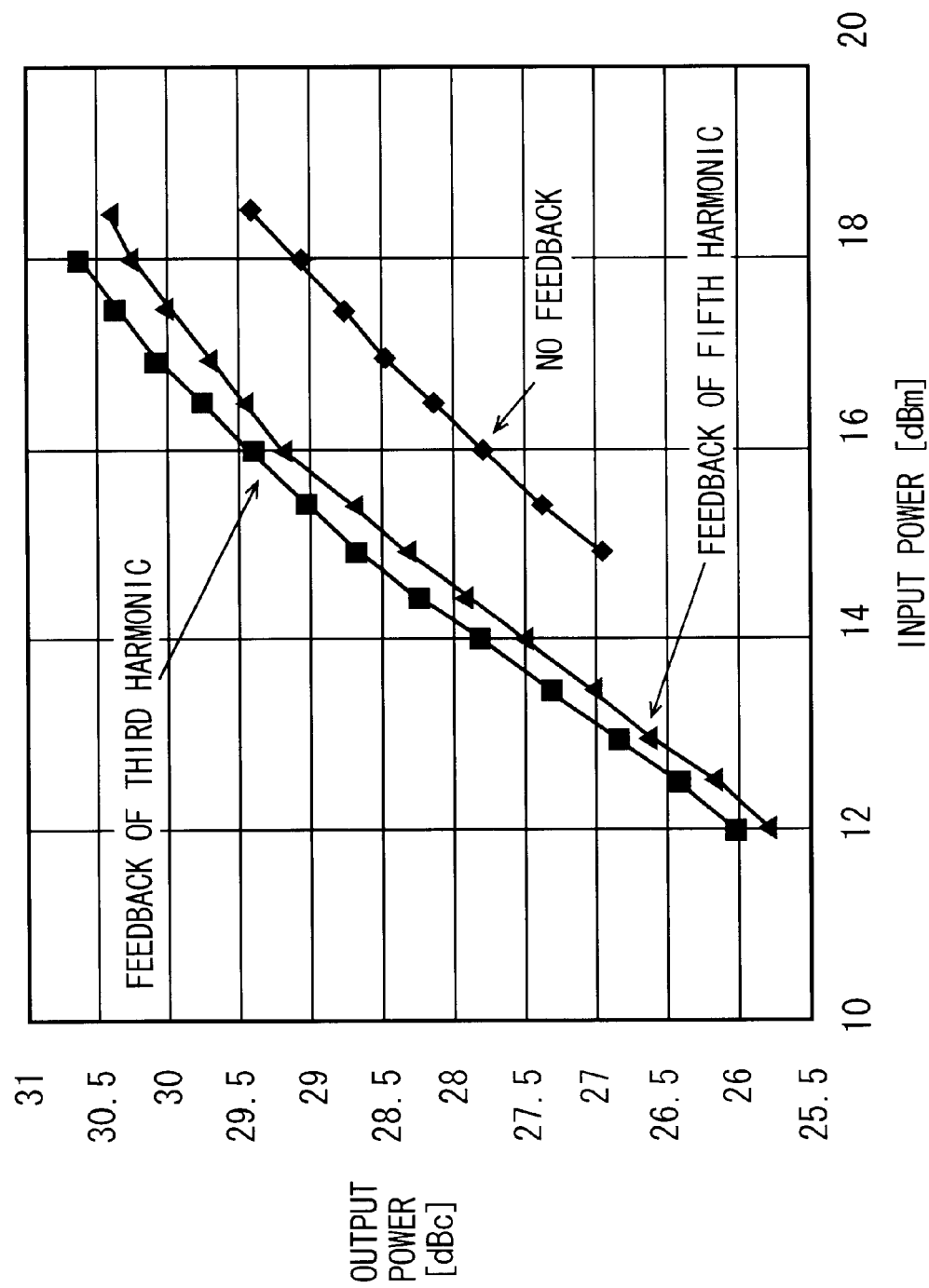
FIG. 9 is a diagram showing the results of measurement of input/output power characteristics.

FIG. 9 is a diagram showing the results of measurement of input/output power characteristics. In FIG. 9, input power is used to enter the horizontal axis, and output power is used to enter the vertical axis.

The gains in output power of 29 dBm are compared. In this case, input power in a case where the output power is 29 dBm is Pin, the gain is expressed by the following equation:

$$Gain[dB]=29-Pin$$

From FIG. 9, the gain is 11.1 dB when there is no feedback circuit 5, is 13.5 dB when the third harmonic is fed back, and is 13.2 dB when the fifth harmonic is fed back. It is found that the gain is increased by using the feedback circuit 5.

Description is now made of an example to which the feedback circuit shown in FIG. 1 is applied and the effect thereof. The largest reason why the input/output characteristics of the power amplifier used for a handy phone set are distorted is that a load curve of an FET is widened as input power increases, and the load curve is clipped by a linear region part and a pinch-off part of the FET in static characteristics. In this case, the shape of the load curve is greatly changed, thereby generating distortion.

Figure 10:
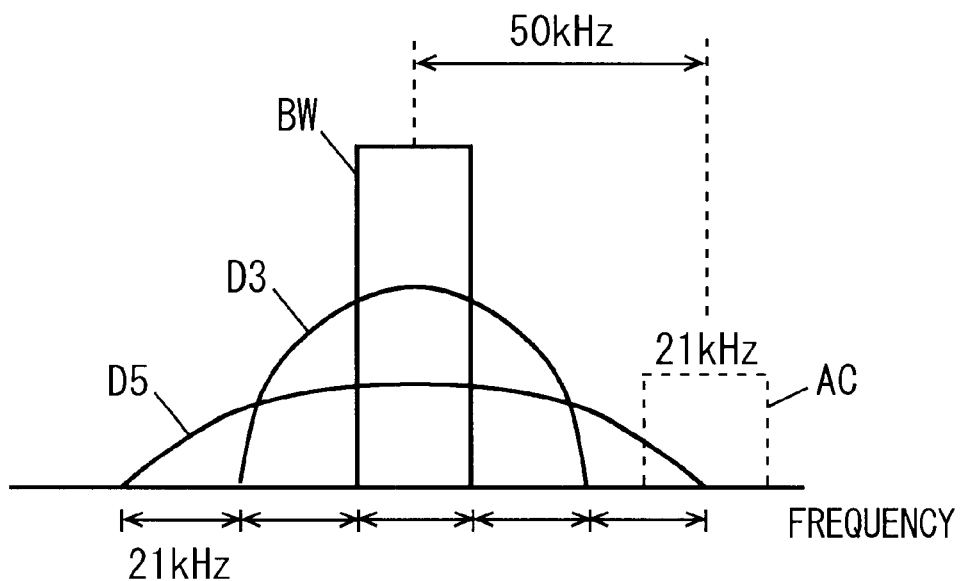
FIG. 10 is a diagram showing adjacent channel leakage power defined in the PDC standard.
Figure 11:
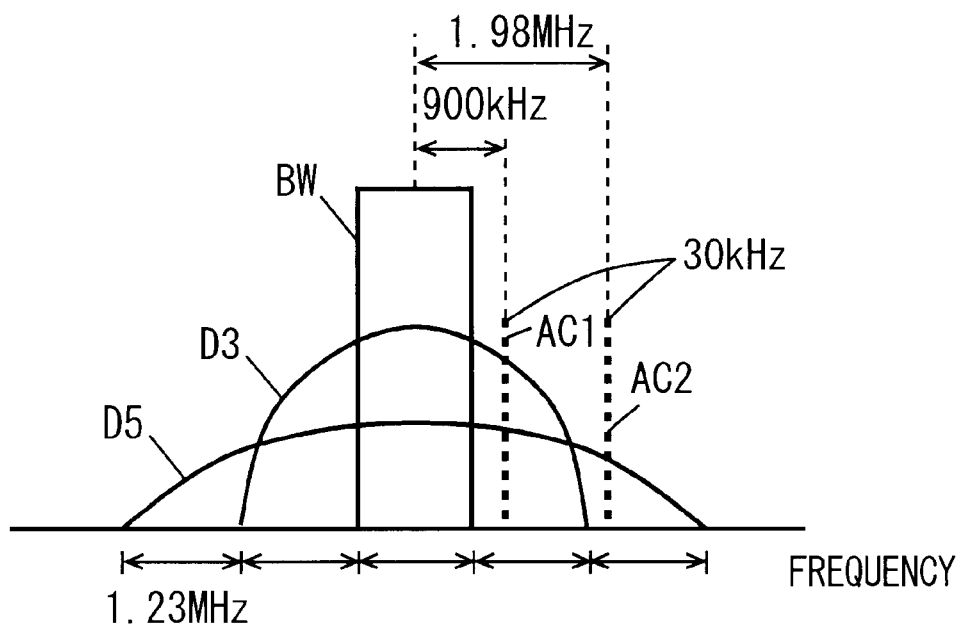
FIG. 11 is a diagram showing adjacent channel leakage power defined in the N-CDMA standard.

FIG. 10 is a diagram showing adjacent channel leakage power defined in the PDC (personal Digital Cellular) standard. FIG. 11 is a diagram showing adjacent channel leakage power defined in the N-CDMA (Narrow-band Code Division Multiple Access) standard.

As shown in FIG. 10, the bandwidth of each channel in the PDC standard is 21 kHz. Third order distortion D3 and fifth order distortion D5 are generated with respect to a fundamental wave BW. In the PDC standard, adjacent channel leakage power AC having a bandwidth of 21 kHz is defined in a position spaced 50 kHz apart from the center frequency of the fundamental wave BW.

As shown in FIG. 11, the bandwidth of each channel in the N-CDMA standard is 1.23 MHz. In the N-CDMA standard, adjacent channel leakage powers AC1 and AC2 having a bandwidth of 30 kHz are respectively defined in a position spaced 900 kHz apart and a position spaced 1.98 MHz apart from the center frequency of the fundamental wave BW.

As shown in FIG. 10, in the PDC standard, the adjacent channel leakage power AC is mainly generated by fifth order distortion. As shown in FIG. 11, in the N-CDMA standard, the adjacent channel leakage powers AC1 and AC2 are mainly generated by third order distortion and fifth order distortion.

Output power $P_{out}$ of the amplifier is expressed by the following equation:

$$P_{out}=a_0+a_1\alpha+a_2\alpha^2+a_3\alpha^3+ \quad (2)$$

In the foregoing equation (2), $a_0$, $a_1$, $a_2$ and $a_3$ are coefficients. $a_1\alpha$ represents the power of the fundamental wave, $a_2 \alpha^2$ represents the power of two order distortion, and $a_3\alpha^3$ represents the power of third order distortion. When $\alpha=\sin x$, the power of the fundamental wave is $a_1\sin x$, the power of the second order distortion is $a_2\sin^2 x$, and the power of the third order distortion is $a_3\sin^3 x$. Further, the power of the second harmonic is proportional to sin2x, and the power of the third harmonic is proportional to sin3x.

As the input/output power increases, adjacent channel leakage power characteristics are degraded, and the harmonic is increased. The harmonic and the distortion have the following relationships;

$$4\sin^3 x=-\sin 3x+3\sin x \quad (3)$$

$$4\cos^3 x=\cos 3x+3\cos x \quad (4)$$

$$16\sin^5 x=\sin 5x-5\sin 3x+10\sin x \quad (5)$$

$$16\cos^5 x=\cos 5x+5\cos 3x+10\cos x \quad (6)$$

The power of the third harmonic is proportional to sin3x or cos3x, and the power of the fifth harmonic is proportional to sin5x or cos5x. Further, the power of the third order distortion is proportional to $\sin^3 x$ or $\cos^3 x$, and the power of the fifth order distortion is proportional to $\sin^5 x$ or $\cos^5 x$.

From the foregoing equations (3) and (4), it is found that the third order distortion is generated from the third harmonic. From the foregoing equations (5) and (6), it is found that the fifth order distortion is generated from the third harmonic and the fifth harmonic. Therefore, the third order distortion is reduced if the third harmonic is restrained, while the fifth order distortion is reduced if the third harmonic and the fifth harmonic are restrained.

In the PDC standard shown in FIG. 10, therefore, the adjacent channel leakage power characteristics can be improved by restraining the third harmonic and the fifth harmonic using the feedback circuits 5a and 5b shown in FIG. 2. Even in the N-CDMA standard shown in FIG. 11, the adjacent channel leakage power characteristics can be improved by restraining the third harmonic and the fifth harmonic using the feedback circuits 5a and 5b shown in FIG. 2.

When a load connected to the FET in order to restrain the harmonic enters a short-circuited state with respect to the harmonic, the power of the harmonic is consumed, so that Joule heat is generated. Therefore, the effect of restraining distortion is small. On the other hand, when the harmonic is negatively fed back by the feedback circuits 5, 5a, and 5b shown in FIGS. 1 and 2, the harmonic is canceled to disappear, so that the power of the harmonic is not consumed in the FET 1. Consequently, it is possible to restrain the harmonic and reduce the distortion.

As described in the foregoing, in the amplifiers in the first and second embodiments, the harmonic is restrained by the feedback circuit 5, 5a, or 5b, thereby making it possible to reduce the distortion represented by the adjacent channel leakage power or the like with respect to the same input power.

In the foregoing equation (2), if the output power $P_{out}$ is made constant, the output power of the fundamental wave is increased by decreasing the distortion. As a result, the power addition efficiency expressed by the foregoing equation (1) is improved, and the gain of the fundamental wave is increased.

Furthermore, the circuit scale of the feedback circuit 5, 5a, or 5b is small, thereby making it possible to miniaturize the amplifier.

Figure 12:
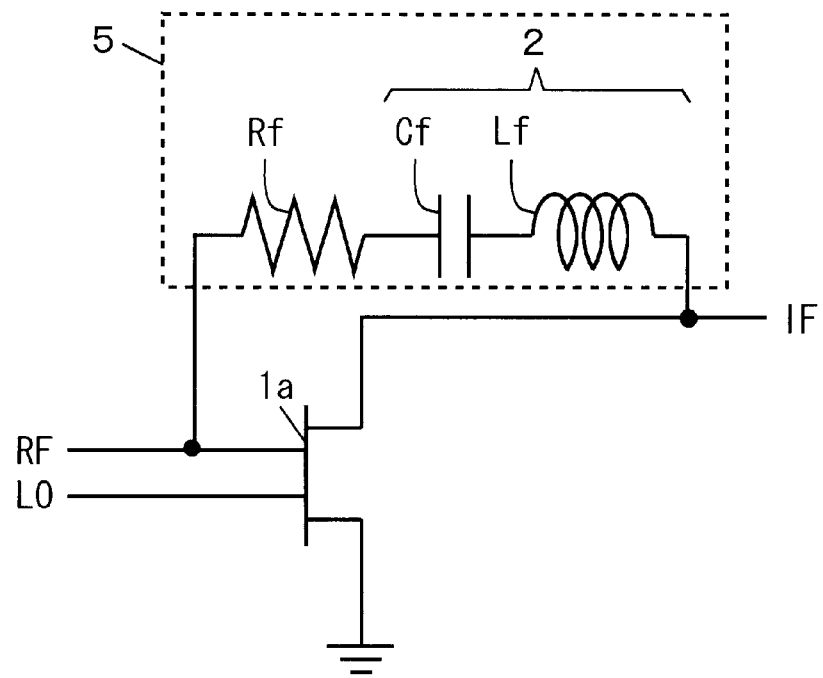
FIG. 12 is a circuit diagram of a mixer comprising a feedback circuit in a third embodiment of the present invention.

FIG. 12 is a circuit diagram of a mixer comprising a feedback circuit in a third embodiment of the present invention.

In FIG. 12, a feedback circuit 5 is connected between a drain electrode and one gate electrode of an FET 1a. The configuration of the feedback circuit 5 is the same as the configuration of the feedback circuit 5 shown in FIG. 1. In the mixer, a high frequency signal RF is inputted to one gate electrode of the FET 1a, and a local oscillation signal LO is inputted to the other gate electrode thereof. Further, an intermediate frequency signal IF is outputted from the drain electrode of the FET 1a.

In the mixer according to the present embodiment, the feedback circuit 5 is provided, as in the amplifiers in the first and second embodiments, thereby making it possible to reduce distortion represented by adjacent channel leakage power or the like with respect to the same input power. The output power of a fundamental wave is increased by reducing the distortion, thereby making it possible to improve power addition efficiency and increase the gain of the fundamental wave. Further, the circuit scale of the feedback circuit 5 is small, thereby making it possible to miniaturize the amplifier.

A frequency used for each channel in the actual mobile communication system has a bandwidth. In a PDC (Personal Digital Cellular) system, for example, an amplifier having a bandwidth of 810 to 885 MHz is required on the receiving side of a portable machine, and an amplifier having a bandwidth of 925 to 958 MHz is required on the transmission side thereof. In the bands, the interval of the channels is 50 kHz, and the occupied bandwidth in the channel is not more than 32 kHz. Similarly, in the PDC system, an amplifier having a bandwidth of 1477 to 1501 MHz is required on the receiving side of the portable machine, and an amplifier having a bandwidth of 1429 to 1453 MHz is required on the transmission side thereof. Further, in a PHS (Personal Handyphone System), amplifiers having a bandwidth of 1895 to 1918 MHz are required on both the receiving side and the transmission side of the portable machine. Both the intervals of the channels in the bands are 300 kHz, and the occupied bandwidth in the channel is not more than 288 kHz.

Furthermore, in an N-CDMA (Narrow-band Code Division Multiple Access) system represented by an IS-95 system, an amplifier having a bandwidth of 832 to 870 MHz is required on the receiving side of the portable machine, and an amplifier having a bandwidth of 887 to 925 MHz is required on the transmission side thereof. In the bands, both the bandwidths of respective one channels are 1.23 MHz. Similarly, in the N-CDMA system, an amplifier having a band from 869 to 894 MHz is required on the receiving side of the portable machine, and an amplifier having a bandwidth of 824 to 849 MHz is required on the transmission side thereof. Further, in the same N-CDMA system, an amplifier having a bandwidth of 1930 to 1990 MHz is required on the receiving side of the portable machine, and an amplifier having a bandwidth of 1850 to 1910 MHz is required on the transmission side thereof.

Furthermore, in a W-CDMA (Wide band Code Division Multiple Access) system represented by an IMT-2000 system, an amplifier having a bandwidth of 1920 to 1980 MHz is required on the receiving side of the portable machine, and an amplifier having a bandwidth of 2110 to 2170 MHz is required on the transmission side thereof. In the bands, both the bandwidths of respective one channels are 5 MHz.

In addition thereto, various systems such as a GSM (Global System for Mobile Communications) system exist. The systems respectively have peculiar bands and channel bandwidths. The bands and the channel bandwidths may, in some cases, vary depending on the frequency of use.

In the first, second and third embodiments, the frequency of the fundamental wave includes parts or all of frequencies in a band corresponding to the above-mentioned system, and also includes a frequency most adjacent to the band corresponding to the system. For example, in the PDC system, there is a case where the frequency of the fundamental wave is represented by 900 MHz. Further, there is a case where a frequency at the center of the band may be used as the frequency of the fundamental wave.

The frequency of the harmonic includes a frequency which is an integral multiple of the frequency in the band including the frequency of the fundamental wave. For example, on the receiving side of the portable machine in the PDC system, the third harmonic is three times 810 to 855 MHz, and has a bandwidth of 2430 to 2655 MHz. The frequency of the third harmonic may, in some cases, be represented by 2700 MHz, similarly to the frequency of the fundamental wave. The same is true for the other harmonics.

Figure 13:
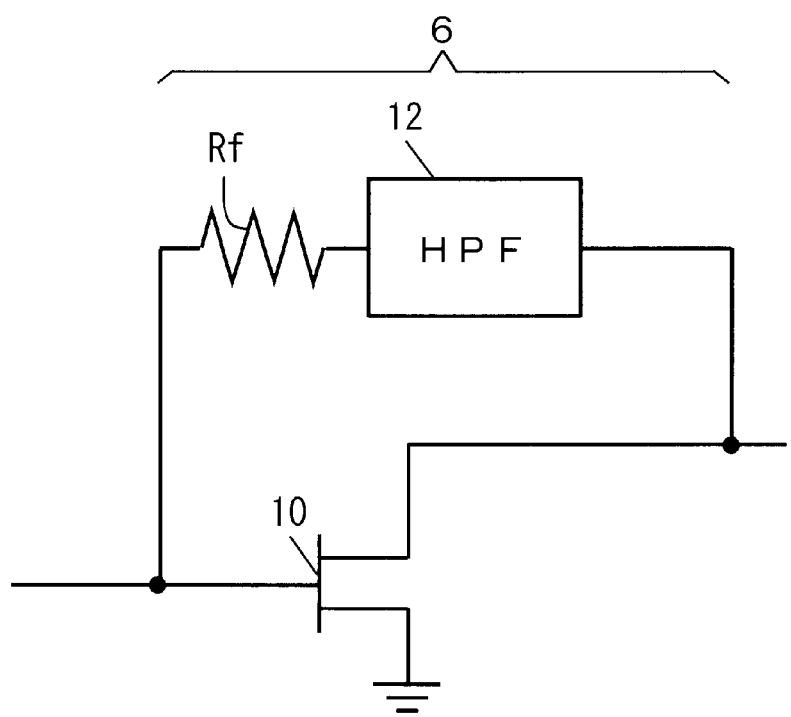
FIG. 13 is a circuit diagram of an amplifier comprising a feedback circuit in a fourth embodiment of the present invention.

FIG. 13 is a circuit diagram of an amplifier comprising a feedback circuit in a fourth embodiment of the present invention.

In FIG. 13, a feedback circuit 6 is connected between a drain electrode (an output terminal) and a gate electrode (an input terminal) of an FET 10. An example of the FET 10 is a power FET. The feedback circuit 6 is constituted by a series connection of a high pass filter (hereinafter referred to as HPF) 12 and a feedback amount adjusting resistor Rf.

It is possible to use as the HPF 12 known HPFs of a Bessel-Thompson type, a Butterworth type, a Chebyshev type, an Elliptic type, a Gaussian type, a PoleZero type, a Polynominal type, a Raised-Cosine type, and so forth. The HPF has the property of passing a frequency component having not less than a predetermined cut-off frequency $f_{cut}$, and not passing but preventing a frequency component lower than $f_{cut}'$. In an ideal HPF, $f_{cut} \approx f_{cut}'$. In the present embodiment, the HPF 12 passes a frequency component having a frequency which is not less than the cut-off frequency $f_{cut}$ in the same phase.

The HPF 12 has the property of passing an m-th harmonic and preventing the fundamental wave, where m is an integer of not less than two. A signal inputted to the gate electrode of the FET 10 and a signal outputted from the drain electrode thereof differ in phase by 180 degrees. Accordingly, the m-th harmonic outputted from the drain electrode of the FET 10 is negatively fed back to the gate electrode. Consequently, the m-th harmonic inputted to the gate electrode is canceled by the m-th harmonic negatively fed back while maintaining the gain of the FET 10 for the fundamental wave. The m-th harmonic is thus restrained, so that m-th order distortion is reduced. In this case, the resistance value of the feedback amount adjusting resistor Rf is adjusted, thereby making it possible to adjust the amount of feedback power.

In the present embodiment, the cut-off frequency $f_{cut}$ of the HPF 12 is set such that a second harmonic and a third harmonic are negatively fed back by the feedback circuit 6, and the fundamental wave is not negatively fed back. When the frequency of the fundamental wave is 750 MHz, for example, only a second harmonic having a frequency of 1.5 GHz and a third harmonic having a frequency of 2.25 GHz are negatively fed back. As a result, the second harmonic and the third harmonic are restrained, so that second order distortion and third order distortion are reduced.

Figure 27:
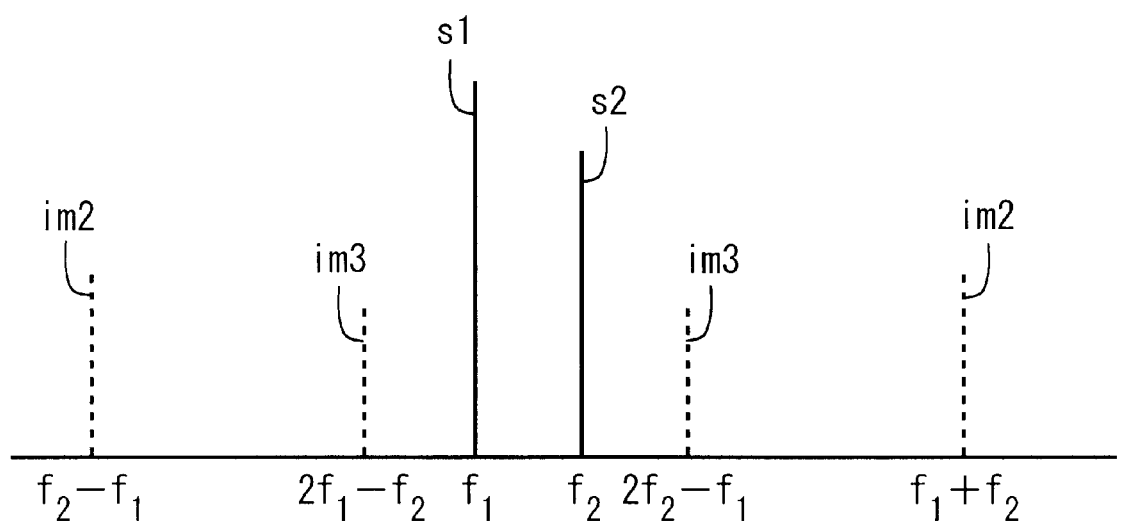
FIG. 27 is a diagram for explaining disturbance waves generated by composite second order distortions and composite third order distortions.

As shown in FIG. 27, when a fundamental wave s1 having a frequency $f_1$ and a fundamental wave s2 having a frequency $f_2$ are inputted to the amplifier shown in FIG. 13, disturbance waves im2 having a frequency $(f_1+f_2)$ and a frequency $(f_2-f_1)$ are generated by composite second order distortions, and disturbance waves im3 having a frequency $(2f_2-f_1)$ and a frequency $(2f_1-f_2)$ are generated by composite third order distortions. In the amplifier shown in FIG. 13, however, the second order distortion and the third order distortion are reduced, so that the respective amounts of generation of the disturbance waves IM2 and the disturbance waves IM3 are reduced.

When a fundamental wave having a frequency of 750 MHz ($f_1$) on a certain channel and a fundamental wave having a frequency of 756 MHz ($f_2$) on the other channel are inputted, for example, disturbance waves having a frequency of 744 MHz ($2f_1-f_2$) and a frequency of 762 MHz ($2f_2-f_1$) by the composite third order distortions is reduced. A three order intercept point (described later) which is an index of intermodulation distortion characteristics is increased. When a fundamental wave having a frequency of 750 MHz ($f_1$) on a certain channel and a fundamental wave having a frequency of 450 MHz ($f_2$) on the other channel are inputted, a disturbance wave having a frequency of 300 MHz ($f_2-f_1$) by the composite second order distortions is reduced. That is, a second order intercept point, described later, is increased.

Figure 14:
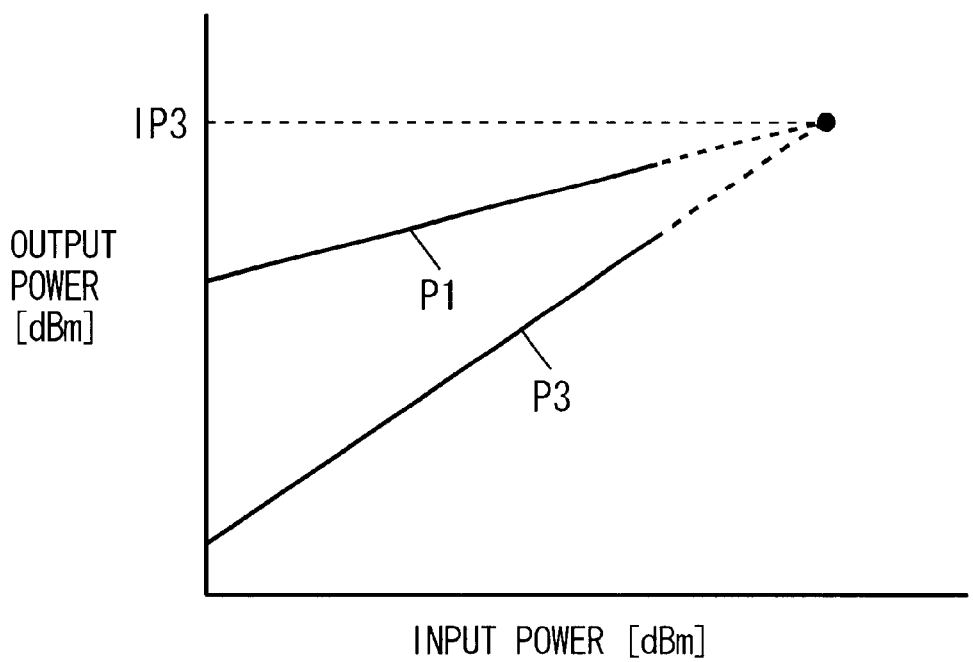
FIG. 14 is a diagram for explaining a method of calculating a third order intercept point.

FIG. 14 is a diagram for explaining a method of calculating the three order intercept point. In FIG. 14, input power is used to enter the horizontal axis, and output power is used to enter the vertical axis.

P1 denotes the output power of a fundamental wave, and P3 denotes the output power of three order distortion. Output power at an intersection of a straight line along a linear region of the output power P1 of the fundamental wave and a straight line along a linear region of the output power P3 of the three order distortion is a three order intercept point (IP3). Similarly, output power at an intersection of the output power P1 of the fundamental wave and the output power of second order distortion (not shown) is a second order intercept point (IP2).

In the amplifier or the mixer, when the distortion is reduced, the three order intercept point (IP3) and the second order intercept point (IP2) are increased. Consequently, an amplifier or a mixer having a large three order intercept point (IP3) and a large second order intercept point (IP2) is desired.

Figure 15:
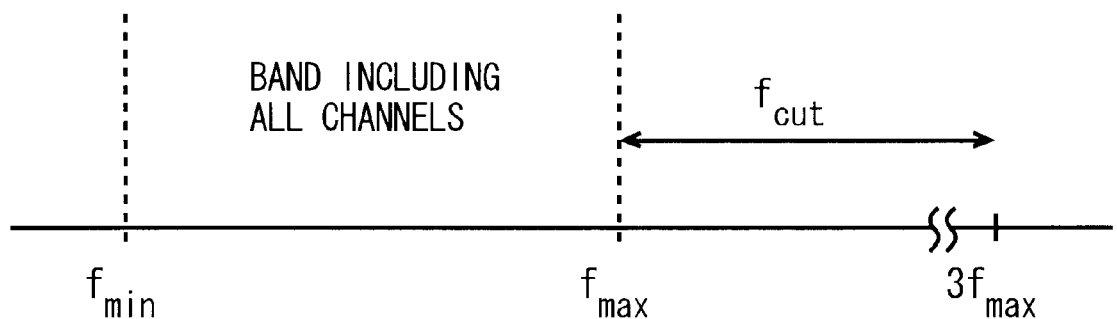
FIG. 15 is a diagram showing the range of the cut-off frequency of an HPF in the feedback circuit shown in FIG. 13.

FIG. 15 is a diagram showing the range of a cut-off frequency $f_{cut}$ of the HPF 12 in the feedback circuit 6 shown in FIG. 13.

In FIG. 15, $f_{min}$ denotes the lowest frequency in the entire band including all channels in a communication system such as a cable television system. $f_{max}$ denotes the highest frequency in the entire band including all the channels. In the amplifier shown in FIG. 13, the cut-off frequency $f_{cut}$ of the HPF 12 in the feedback circuit 6 satisfies a relationship expressed by the following equation over the entire band including all the channels:

$$f_{max} < f_{cut} \leq 3f_{max} \qquad (7)$$

When the cut-off frequency $f_{cut}$ of the HPF 12 in the feedback circuit 6 is set, as expressed by the foregoing equation (7), a harmonic on at least the third or more order with respect to the frequency of at least one channel of a signal outputted from the drain electrode of the FET 10 passes through the HPF 12, and is negatively fed back to the gate electrode. Consequently, the power of the harmonic on at least the third or more order is canceled by the gate electrode of the FET 10, so that the power of the harmonic on at least the third or more order is not generated in the output power.

The harmonic on at least the third or more order with respect to the frequency of at least one channel is thus restrained, thereby reducing composite distortions such as composite second order distortions (CSO), composite third order distortions (CTB), and mixed modulation distortions (X-MOD). Consequently, the distortions can be reduced over the entire band including all the channels.

Particularly when the harmonics on at least the third or more order with respect to the frequencies of a plurality of channels are restrained, the effect of reducing distortion in the entire band including all the channels is increased.

Figure 16:
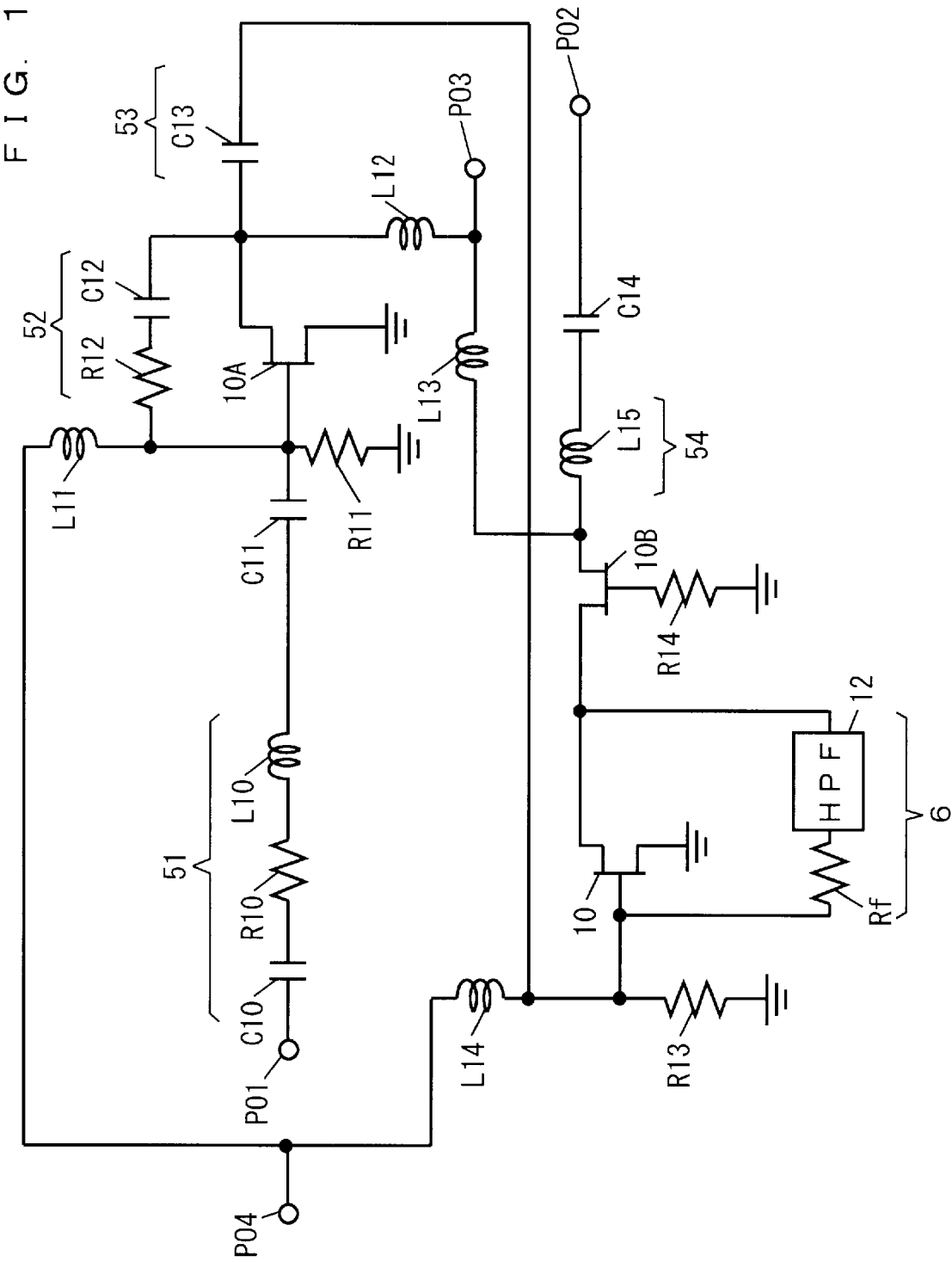
FIG. 16 is a circuit diagram of a two-stage wide band amplifier to which the feedback circuit shown in FIG. 13 is applied.

FIG. 16 is a circuit diagram of a two-stage wide band amplifier to which the feedback circuit 6 shown in FIG. 13 is applied. The two-stage wide band amplifier shown in FIG. 16 is used in a band from 100 to 800 MHz.

In FIG. 16, an MES (metal-semiconductor) FET composed of GaAs is used as FETs 10, 10A, and 10B. A high-frequency signal is inputted to a port PO1. A high-frequency signal is outputted from a port PO2. A drain bias is applied to a port PO3. A gate bias is applied to a port PO4.

The port PO1 is connected to a gate electrode of the FET 10A through an input matching circuit 51 and a DC blocking capacitor C11. The input matching circuit 51 is constituted by a series connection of a capacitor C10, a resistor R10, and an inductor L10. The gate electrode of the FET 10A is grounded through an oscillation preventing resistor R11, and is connected to the port PO4 through a choke coil L11.

A feedback circuit 52 is connected between a drain electrode and a gate electrode of the FET 10A. The feedback circuit 52 is constituted by a series connection of a resistor R12 and a capacitor C12. The drain electrode of the FET 10A is connected to a gate electrode of the FET 10 through an interstage matching circuit 53, and is connected to the port PO3 through a choke coil L12. The interstage matching circuit 53 is composed of a capacitor C13. The capacitor C13 also serves as a DC blocking capacitor.

The gate electrode of the FET 10 is grounded through an oscillation preventing resistor R13, and is connected to the port PO4 through a choke coil L14. A feedback circuit 6 is connected between a drain electrode and the gate electrode of the FET 10. The feedback circuit 6 is constituted by a series connection of a feedback amount adjusting resistor Rf and an HPF 12. The drain electrode of the FET 10 is connected to a source electrode of the FET 10B.

A gate electrode of the FET 10B is grounded through a grounding resistor R14. The drain electrode of the FET 10B is connected to the port PO2 through an output matching circuit 54 and a DC blocking capacitor C14, and is connected to the port PO3 through a choke coil L13. The output matching circuit 54 is composed of an inductor L15.

The FET 10A constitutes an amplifier circuit in the first stage, and the FETs 10 and 10B constitute an amplifier circuit in the final stage. The gain in a low frequency region is restrained by the feedback circuit 52, thereby widening the band of the amplifier circuit in the first stage. The output impedance is close to 50 Ω over the wide band by a cascade connection of the FETs 10 and 10B, thereby widening the band of the amplifier circuit in the final stage.

The high-frequency characteristics of the two-stage wide band amplifier shown in FIG. 16 are found by calculation. The capacitance value of the capacitor C10 is set to 29.6 pF, the resistance value of the resistor R10 is set to 5.41 Ω, the inductance of the inductor L10 is set to 1.71 nH, and the capacitance value of the DC blocking capacitor C11 is set to 1000 pF. Both the resistance values of the oscillation preventing resistors R11 and R13 are 500 Ω. The resistance value of the resistor R12 is set to 238.9 Ω, and the capacitance value of the capacitor C12 is set to 340 pF. The capacitance value of the capacitor C13 is 49.1 pF. All the inductances of the choke coils L11, L12, L13, and L14 are 100 μH. The resistance value of the grounding resistor R14 is 5 kΩ, the inductance of the inductor L15 is 1.83 nH, and the capacitance value of the DC blocking capacitor C14 is 100 pF.

Figure 17:
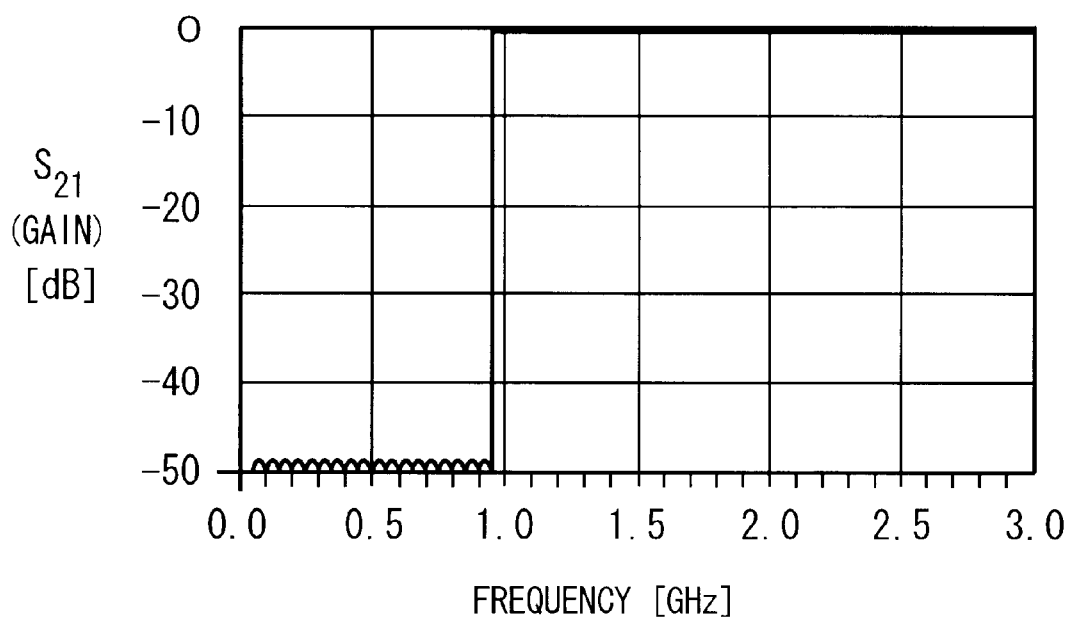
FIG. 17 is a diagram showing the frequency characteristics of $S_{21}$ in an HPF in a feedback circuit.
Figure 18:
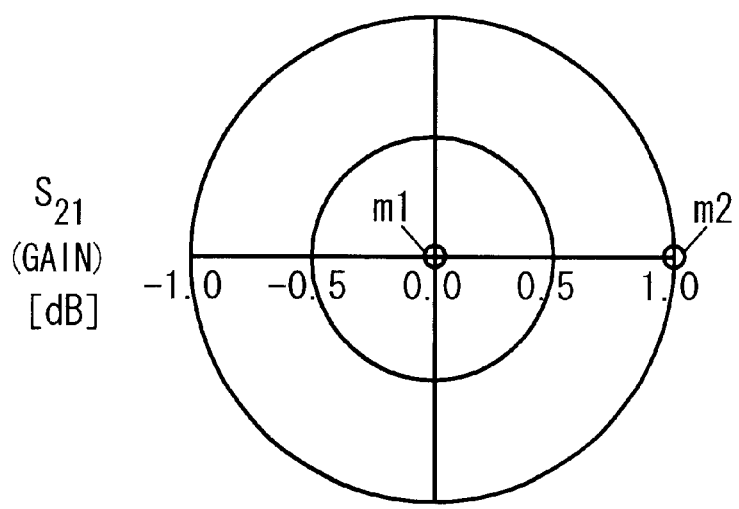
FIG. 18 is a polar chart showing the phase and the magnitude of $S_{21}$ in an HPF in a feedback circuit.

FIG. 17 is a diagram showing the frequency characteristics of $S_{21}$ in the HPF 12 in the feedback circuit 6. FIG. 18 is a polar chart showing the phase and the magnitude of $S_{21}$ in the HPF 12 in the feedback circuit 6. $S_{21}$ is an S parameter representing gain.

As shown in FIG. 17, $S_{21}$ is not less than −50 dB in a range from a direct current to 950 MHz, and is 0 dB at a frequency of not less than 950 MHz. That is, the HPF 12 prevents the frequency in the range from the direct current to 950 MHz, and passes a frequency of not less than 950 MHz.

The magnitude of $S_{21}$ is used to enter the horizontal axis in FIG. 18. In FIG. 18, m1 indicates $S_{21}$ at a frequency of 900 MHz, and m2 indicates $S_{21}$ at a frequency of 3.0 GHz. As indicated by m1 in FIG. 18, the magnitude of $S_{21}$ is zero at the frequency of 900 MHz. As indicated by m2, the magnitude is one and the phase is zero at the frequency of 3.0 GHz. That is, the HPF 12 passes components having a frequency of not less than 950 MHz in the same phase.

In the two-stage wide band amplifier shown in FIG. 16, the port PO1 and the port PO2 are respectively terminated with 50 Ω, to calculate S parameter characteristics from 50 MHz to 3 GHz. As bias conditions, the drain bias of the port PO3 is 6.0 V, and the gate bias of the port PO4 is −1.5 V. Under the same conditions, S parameter characteristics in a case where the feedback circuit 6 is not provided in the two-stage wide band amplifier shown in FIG. 16 are calculated.

Figure 19:
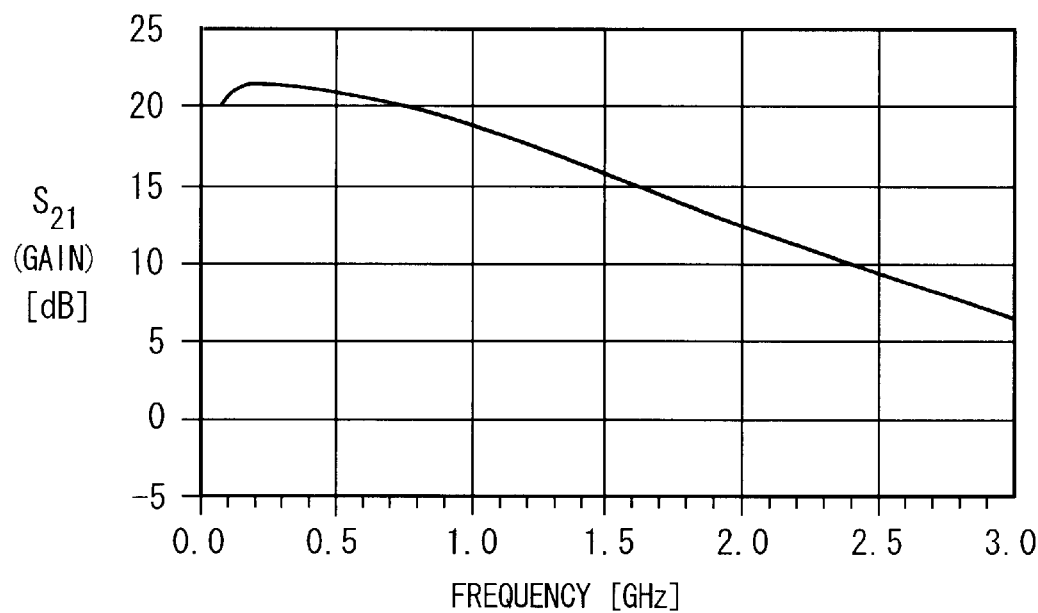
FIG. 19 is a diagram showing the results of calculation of the frequency dependency of $S_{21}$ in a case where no feedback circuit is provided in the two-stage wide band amplifier shown in FIG. 16.
Figure 20:
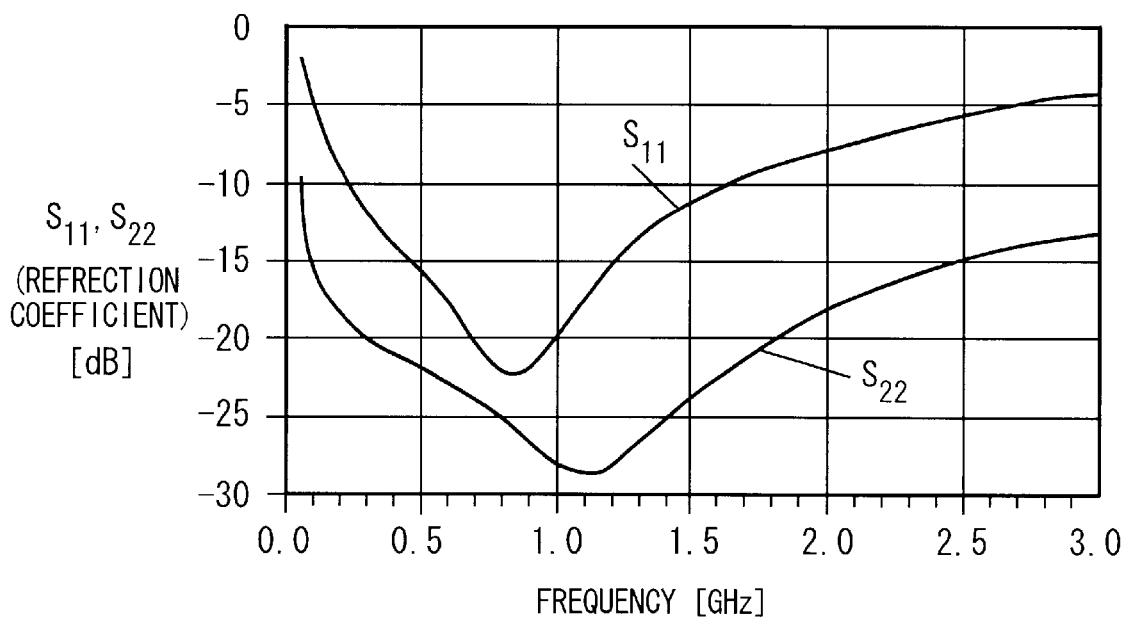
FIG. 20 is a diagram showing the results of calculation of the frequency dependencies of $S_{11}$ and $S_{22}$ in a case where no feedback circuit is provided in the two-stage wide band amplifier shown in FIG. 16.

FIG. 19 is a diagram showing the results of calculation of the frequency dependency of $S_{21}$ in a case where the feedback circuit 6 is not provided in the two-stage wide band amplifier shown in FIG. 16. FIG. 20 is a diagram showing the results of calculation of the frequency dependencies of $S_{11}$ and $S_{22}$ in a case where the feedback circuit 6 is not provided in the two-stage wide band amplifier shown in FIG. 16. $S_{11}$ denotes an S parameter representing an input reflection coefficient, and $S_{22}$ denotes an S parameter representing an output reflection coefficient.

As shown in FIG. 19, in the band from 100 MHz to 800 MHz, $S_{21}$ is 20.0 to 20.5 dB. As shown in FIG. 20, in the band from 100 MHz to 800 MHz, $S_{22}$ is lower than approximately −10 dB, and $S_{11}$ is lower than approximately −5 dB.

Figure 21:
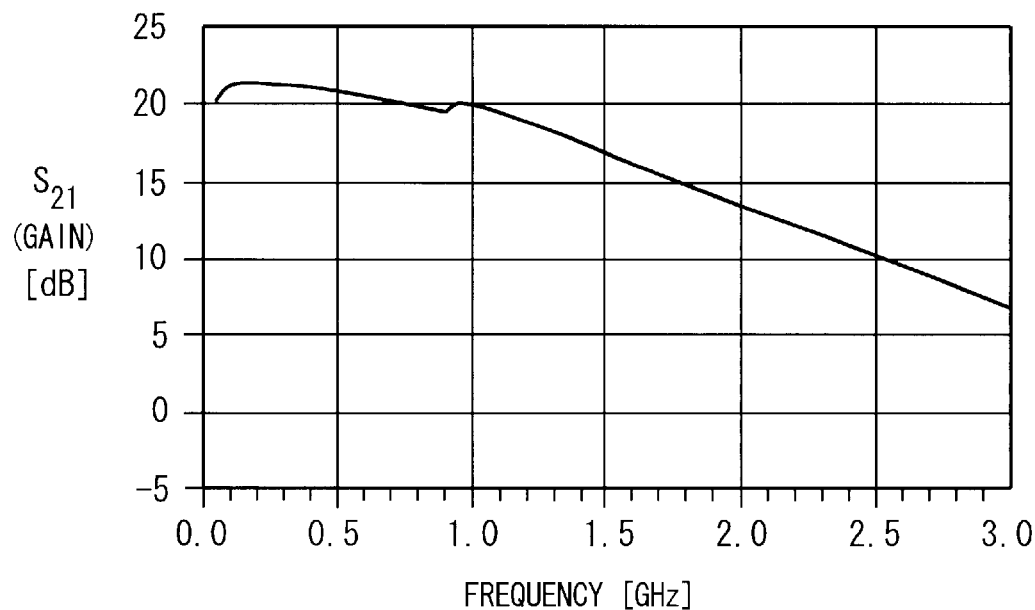
FIG. 21 is a diagram showing the results of calculation of the frequency dependency of $S_{21}$ in a case where a feedback circuit is provided in the two-stage wide band amplifier shown in FIG. 16.
Figure 22:
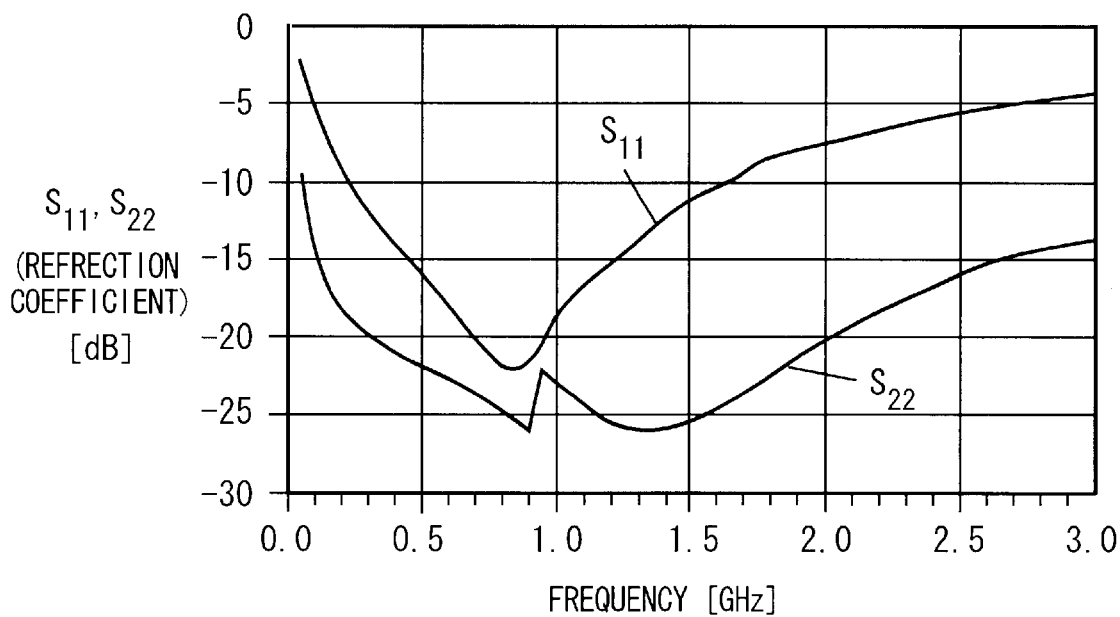
FIG. 22 is a diagram showing the results of calculation of the frequency dependencies of $S_{11}$ and $S_{22}$ in a case where a feedback circuit is provided in the two-stage wide band amplifier shown in FIG. 16.

FIG. 21 is a diagram showing the results of calculation of the frequency dependency of $S_{21}$ in a case where the feedback circuit 6 is provided in the two-stage wide band amplifier shown in FIG. 16. FIG. 22 is a diagram showing the results of calculation of the frequency dependencies of $S_{11}$ and $S_{22}$ in a case where the feedback circuit 6 is provided in the two-stage wide band amplifier shown in FIG. 16.

When the feedback circuit 6 is provided, as shown in FIG. 21, a filter effect is seen in $S_{21}$ at a frequency of 950 MHz. However, in the band from 100 MHz to 800 MHz, $S_{21}$ which is approximately the same as that in a case where the feedback circuit 6 is not provided is obtained. When the feedback circuit 6 is provided, as shown in FIG. 22, a filter effect is seen in $S_{22}$ at a frequency of 950 MHz. In the band from 100 MHz to 800 MHz, $S_{11}$ and $S_{22}$ are respectively lower than approximately −10 dB and approximately −5 dB, as in a case where the feedback circuit 6 is not provided. That is, even when the feedback circuit 6 is provided, the same good gain and reflection coefficient as those in a case where the feedback circuit 6 is not provided are obtained.

The effect of improving distortion by the feedback circuit 6 is then calculated. The resistance value of the feedback amount adjusting resistor Rf is set to 4 kΩ. As bias conditions, the drain bias of the port PO3 is set to 6.0 V, and the gate bias of the port PO4 is set to −1.5 V, as in the calculation of the S parameter. The calculation conditions of intermodulation characteristics are as follows.

The examined frequency is 750 MHz. The first input frequency ($f_1$) is set to 747 MHz, the second input frequency ($f_2$) is set to 753 MHz, and the spacing therebetween is set to 6 MHz. Input power is changed at spacing of 2 dB from −30 dBm to 10 dBm. The calculated frequency ($2f_1-f_2$) of the third order distortion is 741 MHz.

Under these conditions, a third order intercept point (IP3) is calculated. In a linear region, output power P1 of a fundamental wave is proportional to input power, and output power P3 of third order distortion is proportional to three times the input power. Consequently, a straight line proportional to the input power is drawn from the output power P1 of the fundamental wave in input power of −26 dBm, and a straight line proportional to three times the input power is drawn from the output power P3 of the third order distortion in the input power. Output power at an intersection of the straight lines is found as a third order intercept point (IP3).

Figure 23:
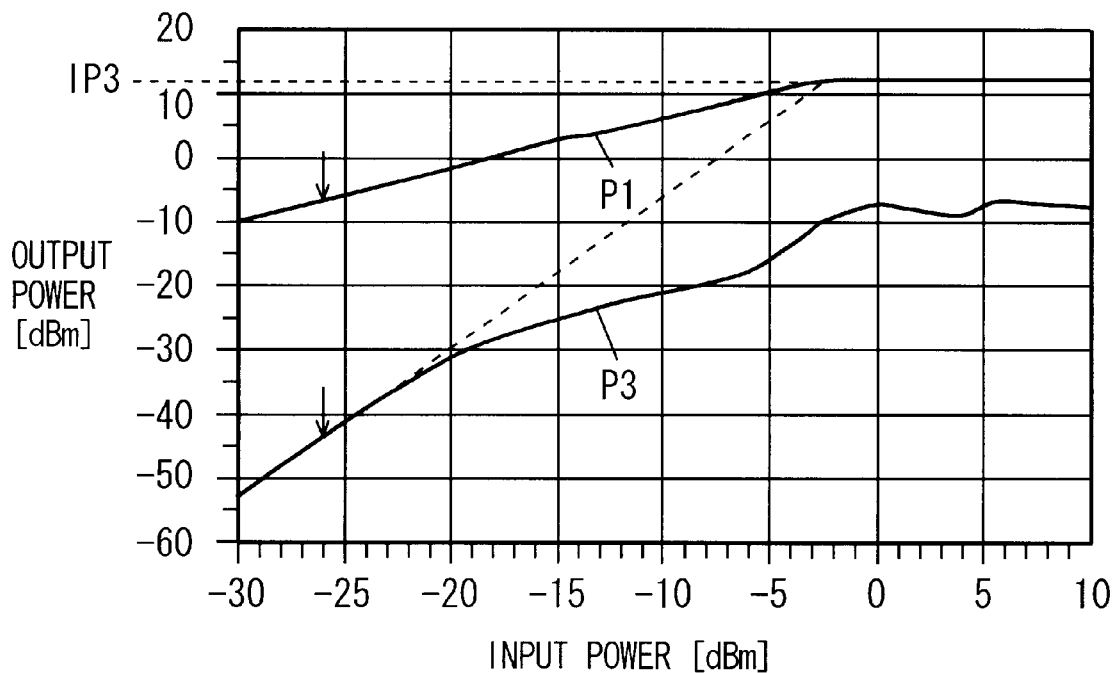
FIG. 23 is a diagram showing the results of calculation of input/output power characteristics of a fundamental wave and third order distortion in a case where no feedback circuit is provided in the two-stage wide band amplifier shown in FIG. 16.
Figure 24:
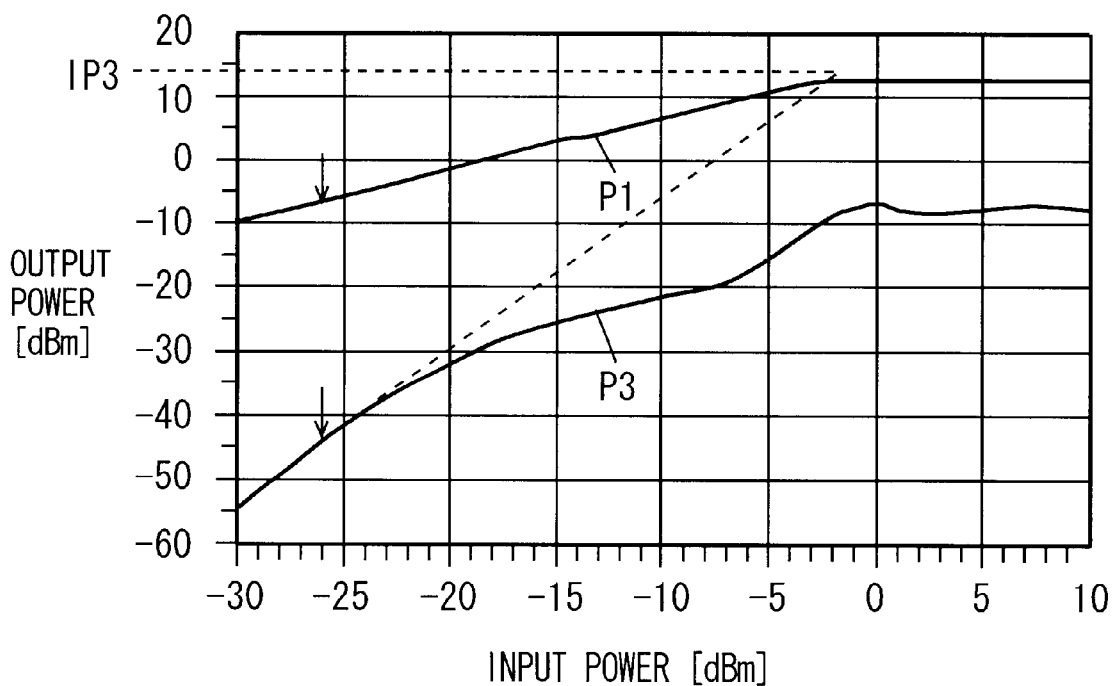
FIG. 24 is a diagram showing the results of calculation of input/output power characteristics of a fundamental wave and third order distortion in a case where a feedback circuit is provided in the two-stage wide band amplifier shown in FIG. 16.

FIG. 23 is a diagram showing the results of calculation of input/output power characteristics of the fundamental wave and the third order distortion in a case where the feedback circuit 6 is not provided in the two-stage wide band amplifier shown in FIG. 16. FIG. 24 is a diagram showing the results of calculation of input/output power characteristics of the fundamental wave and the third order distortion in a case where the feedback circuit 6 is provided in the two-stage wide band amplifier shown in FIG. 16.

The third order intercept point (IP3) found from the results of the calculation shown in FIG. 23 is 12.3 dBm. On the other hand, the third order intercept point (IP3) found from the results of the calculation shown in FIG. 24 is 12.8 dBm. The effect of improving distortion f 0.5 dB is produced by thus providing the feedback circuit 6.

As described in the foregoing, second order distortion and third order distortion are reduced by providing the feedback circuit 6 shown in FIG. 13. Accordingly, composite distortions such as composite second order distortions (CSO), composite triple beat (CTB) and cross modulation (X-MOD) are reduced. Consequently, it is possible to reduce distortion represented by adjacent channel leakage power or the like with respect to the same input power.

Furthermore, a harmonic is canceled to disappear by the gate electrode of the FET 10. Accordingly, the power of the harmonic is not consumed in the FET 10. As a result, the output power of a fundamental wave can be increased, so that the power addition efficiency is improved, and the gain is increased. Further, the circuit scale of the feedback circuit 6 is small, thereby making it possible to miniaturize the amplifier.

In the amplifier shown in FIG. 13, the cut-off frequency $f_{cut}$ of the HPF 12 in the feedback circuit 6 satisfies a relationship expressed by the following equation over the entire band including all the channels in the communication system.

$$f_{cut} > 3f_{max} \quad (8)$$

When the cut-off frequency $f_{cut}$ of the HPF 12 in the feedback circuit 6 is set, as expressed by the foregoing equation (8), at least one harmonic on the fourth or more order with respect to the frequency of at least one channel of the signal outputted from the drain electrode in the FET 10 passes through the HPF 12, and is negatively fed back to the gate electrode. Consequently, the power of the at least one harmonic on the fourth or more order is canceled by the gate electrode of the FET 10 by the power of at least one harmonic on the fourth or more order negatively fed back, so that the at least one harmonic on the fourth or more order is not produced in output power.

Fourth order distortion is generated by a second harmonic and a fourth harmonic, and fifth order distortion is generated by a third harmonic and a fifth harmonic. When the cut-off frequency $f_{cut}$ is set, as expressed by the foregoing equation (8), the effect of reducing distortion is smaller, as compared with that in a case where the third harmonic is restrained. However, at least one harmonic on the fourth or more order corresponding to the frequency of the at least one channel is restrained, thereby improving composite distortions, as compared with that in a case where the harmonic is not negatively fed back.

Particularly in the PDC standard shown in FIG. 10, the adjacent channel leakage power is reduced by restraining fifth order distortion. Accordingly, the restraint of the harmonic on the fourth or more order is effective in reducing the distortion.

Although in the present embodiment, the property of the HPF 12 is set such that the difference between the phase of a harmonic negatively fed back to the gate electrode of the FET 10 from the drain electrode thereof and the phase of a harmonic inputted to the gate electrode is 180 degrees. However, the difference between the phase of the harmonic negatively fed back to the gate electrode of the FET 10 from the drain electrode thereof and the phase of the harmonic inputted to the gate electrode may be set to an arbitrary value in a range from 90 degrees to 270 degrees.

Figure 25:
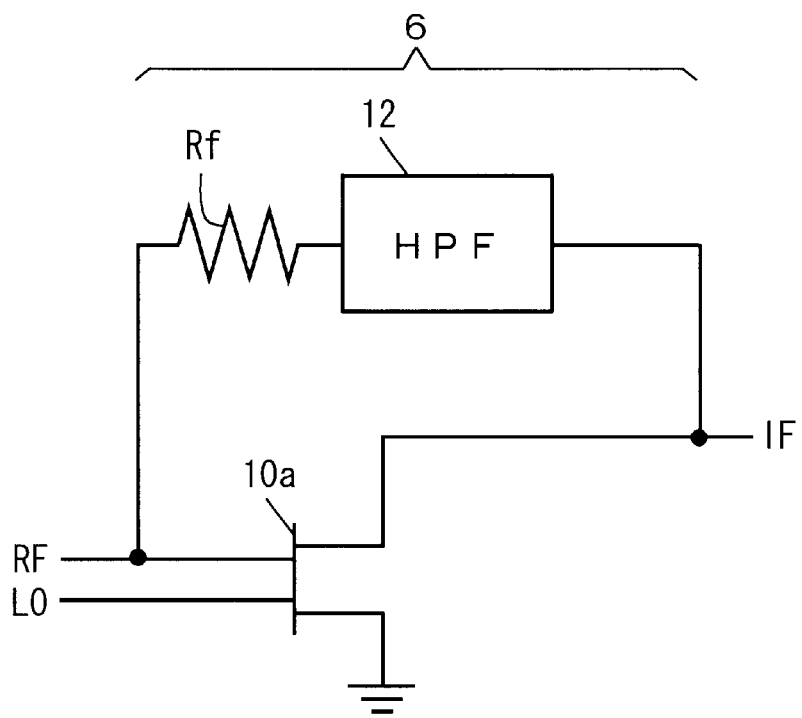
FIG. 25 is a circuit diagram of a mixer comprising a feedback circuit according to a fifth embodiment of the present invention.
Figure 26:
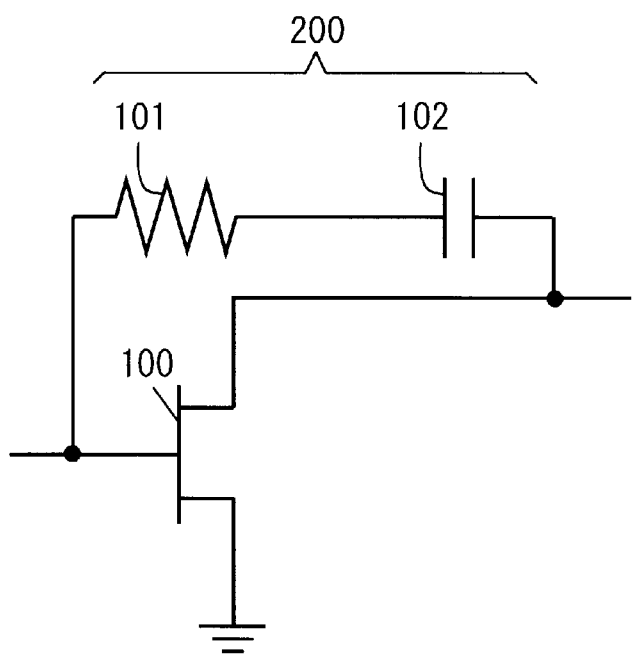
FIG. 26 is a circuit diagram of an amplifier comprising a conventional feedback circuit.

FIG. 25 is a circuit diagram of a mixer comprising a feedback circuit in a fourth embodiment of the present invention.

In FIG. 25, a feedback circuit 6 is connected between a drain electrode and one gate electrode of an FET 10a. The configuration of the feedback circuit 6 is the same as the configuration of the feedback circuit 6 shown in FIG. 13. In the mixer, a high-frequency signal RF is inputted to the one gate electrode of the FET 10a, a local oscillation signal LO is inputted to the other gate electrode. Further, an intermediate frequency signal IF is outputted from the drain electrode of the FET 10a.

In the mixer according to the present embodiment, second order distortion and third order distortion are reduced by providing the feedback circuit 6, as in the amplifier in the third embodiment. Accordingly, composite distortions such as composite second order distortions (CSO), composite triple beat (CTB), and cross modulation (X-MOD) are reduced. Consequently, it is possible to reduce distortion represented by adjacent channel leakage power or the like with respect to the same input power.

Furthermore, a harmonic is canceled to disappear by the gate electrode of the FET 10a. Accordingly, the power of the harmonic is not consumed in the FET 10a. As a result, the output power of a fundamental wave can be increased, so that the power addition efficiency is improved, and the gain is increased. Further, the circuit scale of the feedback circuit 6 is small, thereby making it possible to miniaturize the amplifier.

In the fourth and fifth embodiments, the frequency of the fundamental wave includes parts or all of frequencies in a band corresponding to a system such as PDC, PHS, N-CDMA, or W-CDMA, described above, a cable system, or the like. For example, the frequency of the fundamental wave includes a band from 100 to 800 MHz. The frequency of the harmonic in this case includes a frequency which is an integral multiple of the frequency in the band including the frequency of the fundamental wave. For example, the frequency of the second harmonic is twice 100 to 800 MHz, and has a bandwidth of 200 to 1600 MHz.

In this case, there exists a range in which the frequency of the fundamental wave and the frequency of the harmonic are overlapped with each other, the range in which they are overlapped with each other is selected as either the frequency of the fundamental wave or the frequency of the harmonic depending on uses. For example, the frequency of the fundamental wave is represented by 500 to 800 MHz which is a part of the band from 100 to 800 MHz. The frequency of the second harmonic is 1000 to 1600 MHz. The frequencies are set such that the frequency of the fundamental wave and the frequency of the second harmonic are not overlapped with each other. The same is true for the other harmonics.

The negative feedback circuits 5, 5a, 5b, and 6 in the present embodiment are not limited to the amplifier and the mixer. For example, they can be used as various circuits comprising a transistor.

Although in the above-mentioned embodiments, the FET is used as a transistor, a bipolar transistor may be used as a transistor.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A feedback circuit connected between an output terminal and an input terminal of a transistor, comprising:
   at least one series connection circuit comprising a series connection of a capacitance and an inductance, said at least one series connection circuit being connected between the output terminal and the input terminal of said transistor,
   wherein the value of said capacitance and the value of said inductance of said at least one series connection circuit is set such that said at least one series connection circuit enters a substantially opened state with respect to a first frequency, and said at least one series connection circuit enters a substantially short-circuited state with respect to a second frequency.

2. The feedback circuit according to claim 1, wherein said first frequency is the frequency of a fundamental wave, and
   said second frequency is the frequency of a harmonic corresponding to said fundamental wave.

3. The feedback circuit according to 2, wherein said second frequency is the frequency of a third harmonic or a fifth harmonic corresponding to said fundamental wave.

4. The feedback circuit according to claim 1, wherein said second frequency is the frequency of a fundamental wave, and
   the first frequency is the frequency of a harmonic corresponding to said fundamental wave.

5. The feedback circuit according to claim 4, wherein said first frequency is the frequency of a third harmonic or a fifth harmonic corresponding to said fundamental wave.

6. The feedback circuit according to claim 1, further comprising:
   a feedback amount adjusting resistor connected in series with said at least one series connection circuit.

7. A feedback circuit connected between an output terminal and an input terminal of an FET transistor, comprising:
   a high pass filter having the property of preventing a component having a first frequency and passing a component having a second frequency higher than said first frequency; and
   a feedback amount adjusting resistor connected in series with said high pass filter.

8. The feedback circuit according to claim 7, wherein said first frequency is included in a band including a channel to be used, and
   the cut-off frequency of said high pass filter is higher than the highest frequency in the band including said channel.

9. The feedback circuit according to claim 7, wherein the cut-off frequency of said high pass filter is not more than three times the highest frequency in the band including said channel.

10. An amplifier comprising:

a transistor; and a feedback circuit connected between an output terminal and an input terminal of said FET transistor, said feedback circuit comprising:

at least one series connection circuit comprising a series connection of a capacitance and an inductance, said at least one series connection circuit being connected between the output terminal and the input terminal of said transistor, wherein the value of said capacitance and the value of said inductance of said at least one series connection circuit is set such that said at least one series connection circuit enters a substantially opened state with respect to a first frequency, and said at least one series connection circuit enters a substantially short-circuited state with respect to a second frequency.

11. An amplifier comprising:

a transistor; and a feedback circuit connected between an output terminal and an input terminal of said transistor, said feedback circuit comprising a high pass filter having the property of preventing a component having a first frequency and passing a component having a second frequency higher than said first frequency, and said feedback circuit further comprising a feedback amount adjusting resistor connected in series with said high pass filter.

12. The amplifier according to claim 11, wherein said first frequency is included in a band including a channel to be used, and the cut-off frequency of said high pass filter is higher than the highest frequency in the band including said channel.

* * * * *